(12) United States Patent
Joseph et al.

(10) Patent No.: US 10,727,273 B2
(45) Date of Patent: Jul. 28, 2020

(54) MAGNETORESISTIVE RANDOM ACCESS MEMORY THIN FILM TRANSISTOR UNIT CELL

(71) Applicant: International Business Machines Corporation, Armonk, NY (US)

(72) Inventors: Praveen Joseph, Albany, NY (US); Xuefeng Liu, Schenectady, NY (US); Gauri Karve, Cohoes, NY (US); Eric Raymond Evarts, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/159,798

(22) Filed: Oct. 15, 2018

(65) Prior Publication Data

US 2020/0119093 A1    Apr. 16, 2020

(51) Int. Cl.
| | |
|---|---|
| *H01L 27/22* | (2006.01) |
| *H01L 43/02* | (2006.01) |
| *H01L 43/08* | (2006.01) |
| *H01L 43/10* | (2006.01) |
| *H01L 43/12* | (2006.01) |

(52) U.S. Cl.
CPC ............ *H01L 27/228* (2013.01); *H01L 43/02* (2013.01); *H01L 43/08* (2013.01); *H01L 43/10* (2013.01); *H01L 43/12* (2013.01)

(58) Field of Classification Search
CPC ....... H01L 27/228; H01L 43/02; H01L 43/08; H01L 43/10; H01L 43/12
USPC ......................................................... 257/421
See application file for complete search history.

(56) References Cited

U.S. PATENT DOCUMENTS

| | | | |
|---|---|---|---|
| 2007/0194450 A1 | 8/2007 | Tyberg et al. | |
| 2014/0353662 A1* | 12/2014 | Shukh | ................. H01L 27/2481 257/43 |
| 2015/0249096 A1 | 9/2015 | Lupino et al. | |

* cited by examiner

*Primary Examiner* — Tong-Ho Kim
(74) *Attorney, Agent, or Firm* — Fleit Intellectual Property Law; Thomas S. Grzesik

(57) ABSTRACT

A MRAM-TFT unit cell and a method for fabricating the same. The MRAM-TFT unit cell includes a MRAM device and a TFT device electrically coupled to the MRAM device. The MRAM device and the TFT device are situated within a common plane of the MRAM-TFT cell. The method includes forming a TFT device comprising a source/drain region, and a semiconducting layer on a substrate. A magnetic tunnel junction stack (MTJ) is formed in contact with the source region. A first contact is formed on the MTJ, and a second contact is formed on the drain region. A first interconnect metal layer is formed in contact with the first contact, and a second first interconnect metal layer is formed in contact with the second contact. A third contact is formed on a gate region of the TFT device. A third interconnect metal layer is formed in contact with the third contact.

20 Claims, 28 Drawing Sheets

MAGNETORESISTIVE RANDOM ACCESS MEMORY THIN FILM TRANSISTOR UNIT CELL

BACKGROUND OF THE INVENTION

The present disclosure generally relates to the field of semiconductors, and more particularly relates to magnetoresistive random access memory devices.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store memory and is termed the "free magnet" or "free-layer". This configuration is known as a magnetic tunnel junction (MTJ) and is the simplest structure for a MRAM bit. A memory device is typically built from a grid of such "cells".

SUMMARY OF THE INVENTION

In one embodiment, a method for forming tapered semiconductor devices is disclosed. The method comprises forming a thin-film transistor in contact with a source region, a drain region, and a semiconducting layer on a substrate. A magnetic tunnel junction stack is formed in contact with the source region. A first contact is formed on the source region of the thin-film transistor, and a second contact is formed on the drain region of the thin-film transistor. A first interconnect metal layer is formed in contact with the first contact, and a second first interconnect metal layer is formed in contact with the second contact. A third contact is formed on the thin-film transistor. A third interconnect metal layer is formed in contact with the third contact.

In another embodiment, a semiconductor device is disclosed. The semiconductor device comprises a MRAM device and a thin-film transistor (TFT) device electrically coupled to the MRAM device. The MRAM device and the TFT device are situated within a common plane of the semiconductor device. The MRAM device and the TFT device form a MRAM-TFT device In a further embodiment, another semiconductor device is disclosed. The semiconductor device comprises a first magnetoresistive random access memory (MRAM) device. A first thin-film transistor (TFT) device is electrically coupled to the MRAM device. The first MRAM device and the first thin-film transistor are situated within a common plane of the semiconductor device. The first MRAM device and the first TFT device forming a first MRAM-TFT device. The semiconductor device further comprises a second MRAM device and a second TFT device that is electrically coupled to at least the second MRAM device. The second MRAM device and the second TFT device are situated within a common plane of the semiconductor device. The second MRAM device and the second TFT device form a second MRAM-TFT device situated above the first MRAM-TFT device. The first MRAM device and the second MRAM device share a common word line metal layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
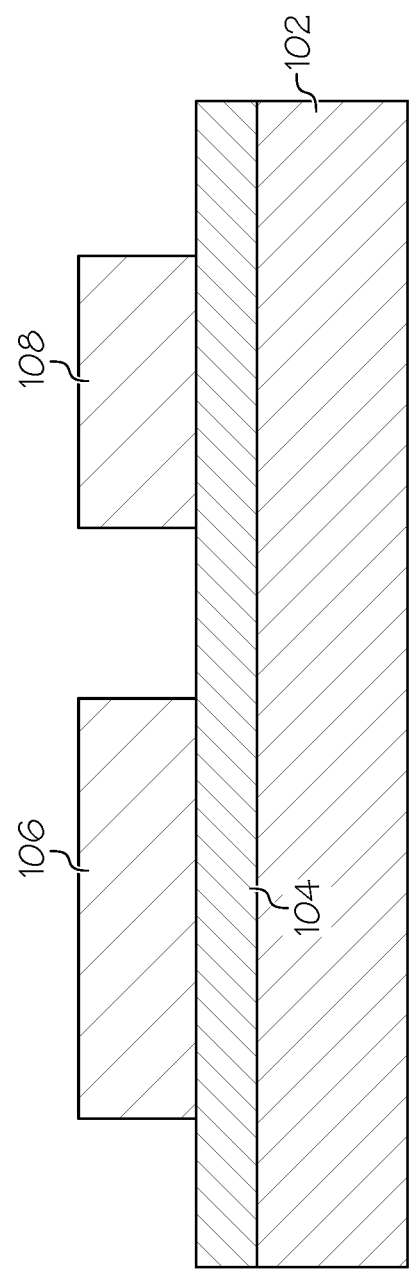
FIG. 1 is a cross-sectional view of a semiconductor structure after patterning masks have been formed on a bottom plate metal layer according to one embodiment of the present invention.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Most conventional approaches for MRAM unit fabrication attempt to optimize the front-end-of-line (FEOL) floor plan by scaling CMOS transistor packing densities along with efficient wiring in order to save real state. Conventional fabrication processes generally fabricate the MRAM memory unit in the back-end-of-line (BEOL), while the drive transistors reside in the FEOL. This makes vertical stacking more difficult and consumes more real estate. Embodiments, of the present invention overcome these problems by providing a planar layout for the MRAM device and transistor as compared to conventional MRAM (BEOL) and FET (FEOL) layouts. In at least some embodiments, thin-film transistors (TFTs) may serve as the access transistors to the unit cells. The thin-film transistor may be one of a planar configuration such as a top-gate device or a bottom-gate device that is arranged in a coplanar fashion or in a staggered fashion. The planar MRAM and FET configuration of one or more embodiments allows for multilayer stacking of these devices to build an integrated three-dimensional stack. Each planar layout may be a 2×2 array (4 FETs, 4 MRAMs), a 3×3 array (9 FETs, 9 MRAMs), etc. The planar layout may be stacked on top of a previous planar layout with an inter-layer dielectric (ILD) in between. The total real estate in such a structure may be determined by the footprint of the planar layout.

FIGS. 1-17 illustrate various processes for fabricating MRAM thin-film transistor unit cells according to various embodiments of the present invention. In FIG. 1, a structure is shown comprising a substrate 102, a bottom plate metal layer 104, and patterning masks 106, 108. In one embodiment, the substrate 102 may comprise silicon. In other embodiments, the substrate 102 may be a transparent substrate comprising materials such as quartz or may be a flexible substrate comprising materials such as polyimide or polycarbonate. The bottom plate metal layer 104 may comprise any material suitable for forming a source/drain. Non-limiting examples of suitable source/drain materials include aluminum (Al), silicon (Si), scandium (Sc), titanium (Ti), vanadium (V), chromium (Cr), manganese (Mn), iron (Fe), yttrium (Y), zirconium (Zr), niobium (Nb), molybdenum (Mo), hafnium (Hf), tantalum (Ta), tungsten (W), mixtures or alloys thereof, and/or the like. The bottom plate metal layer 104 may be formed using, for example chemical vapor deposition (CVD), plasma enhanced chemical vapor deposition (PECVD), chemical solution deposition, atomic layer deposition (ALD), sputtering, plating, evaporation, and/or the like.

Figure 2:
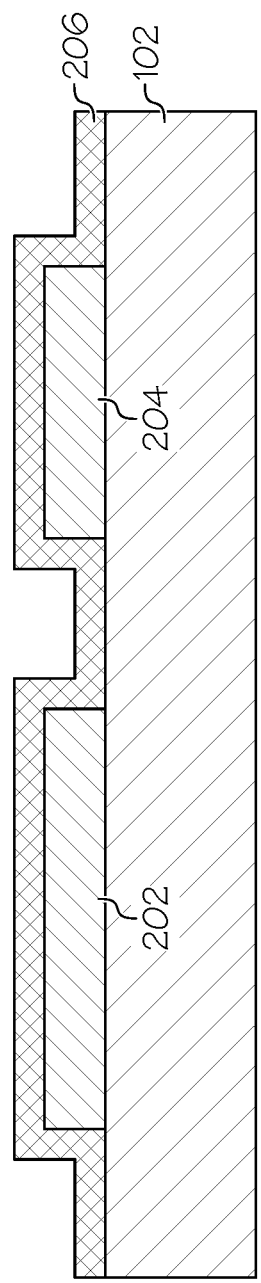
FIG. 2 is a cross-sectional view of a semiconductor structure after a thin-film semiconductor material has been deposited on source and drain regions according to one embodiment of the present invention.

FIG. 2 shows that an etching process such as reactive ion etching (RIE) is performed to define source and drain regions 202, 204 from the metal layer 104. The etching process removes exposed portions of the metal layer 104 that are not protected by the patterning masks 106, 108 and stops on the substrate 102. After the source and drain regions 202, 204 have been formed, one or more thin-film semiconductor materials 206 may be deposited over the structure in contact with and conforming to the exposed portions of the substrate 102; sidewalls of the source/drain regions 202, 204; and the top surface of the source/drains 202, 204. The thickness of the thin-film semiconductor material(s) 206 may range from 10 nm to 2000 nm. Examples of thin-film semiconductor materials include, but are not limited to, amorphous silicon; low temperature polysilicon; conductive metal oxides such as indium oxide (InO), gallium oxide (GaO), zinc oxide (ZnO), tin oxide (SnO), indium tin oxide (InSnO), indium gallium oxide (InGaO), zinc tin oxide (ZnSnO), indium zinc oxide (InZnO), gallium indium zinc oxide (GaInZn), and/or the like; organic semiconductors such as, but not limited to, polythiophene and pentacene; and/or the like. The one or more thin-film semiconductor materials 206 may be deposited by atomic layer deposition (ALD), chemical vapor deposition (CVD), physical vapor deposition (PVD), sputtering, evaporation, solution processing, and/or the like.

Figure 3:
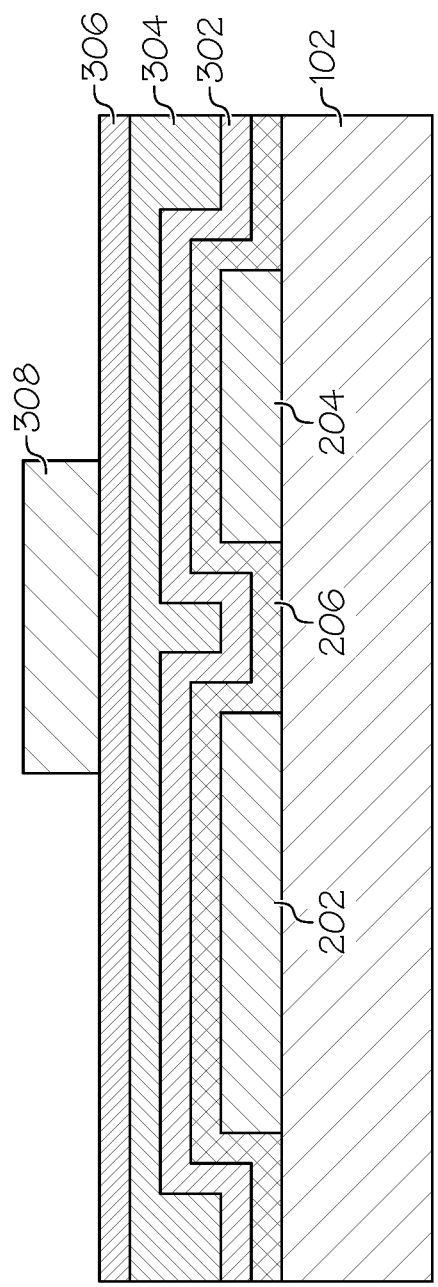
FIG. 3 is a cross-sectional view of a semiconductor structure after a gate dielectric material and gate metal material have been formed on the thin-film semiconductor material according to one embodiment of the present invention.

One or more gate dielectric materials 302 may then deposited over the structure in contact with and conforming to the top surface and sidewalls of the thin film semiconductor material(s) 206, as shown in FIG. 3. In some embodiments, ALD may be used to deposit the gate dielectric material 302 but other deposition processes are applicable as well. Non-limiting examples of gate dielectric materials include oxides, nitrides, oxynitrides of silicon, and other applicable gate dielectric materials. FIG. 3 also shows that one or more gate metal layers 304 are deposited over the structure in contact with the top surface and sidewalls of the gate dielectric material(s) 302. The gate metal material(s) 304 fills in any gaps between portions of the gate dielectric material(s) 302 and has a planar top surface. Non-limiting example of gate materials include polycrystalline silicon, a metal (e.g., tungsten, titanium, tantalum, ruthenium, zirconium, cobalt, copper, aluminum, lead, platinum, tin, silver), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gate metal material may further comprise dopants that are incorporated during or after deposition. The gate metal material may comprises multiple layers such as gate work function setting layer and gate conductive layer.

A hard mask 306 may then be formed on and in contact with the top surface of the gate metal layer(s) 304 using one or more deposition processes. Non-limiting examples of hard mask materials include silicon nitride, silicon oxide, a combination thereof, titanium nitride, and/or the like. A patterning mask 308 is then formed over and in contact with a portion of the gate metal layer(s) 304 to define the transistor gate. The mask 308 may be formed using industry-standard lithographic techniques. For example, lithography may include direct application of photoresist (PR) or use of more complex stacks such as tri-layer (e.g., from bottom to top: OPL (optical planarization layer), SiARC (Si-containing anti-reflective coating/SiOx, PR) or quad-layer stacks.

Figure 4:
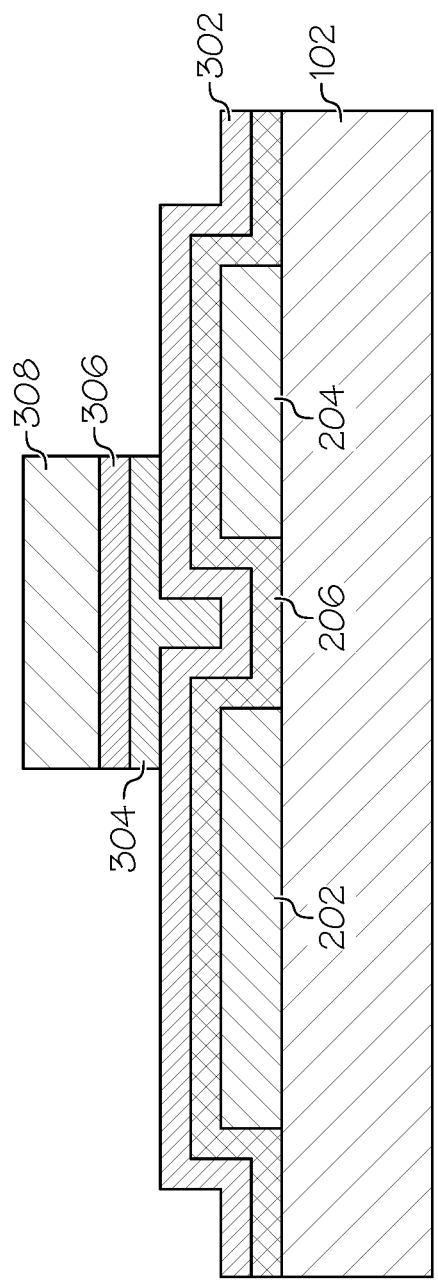
FIG. 4 is a cross-sectional view of a semiconductor structure after the gate metal material has been patterned in to a gate metal layer according to one embodiment of the present invention.
Figure 5:
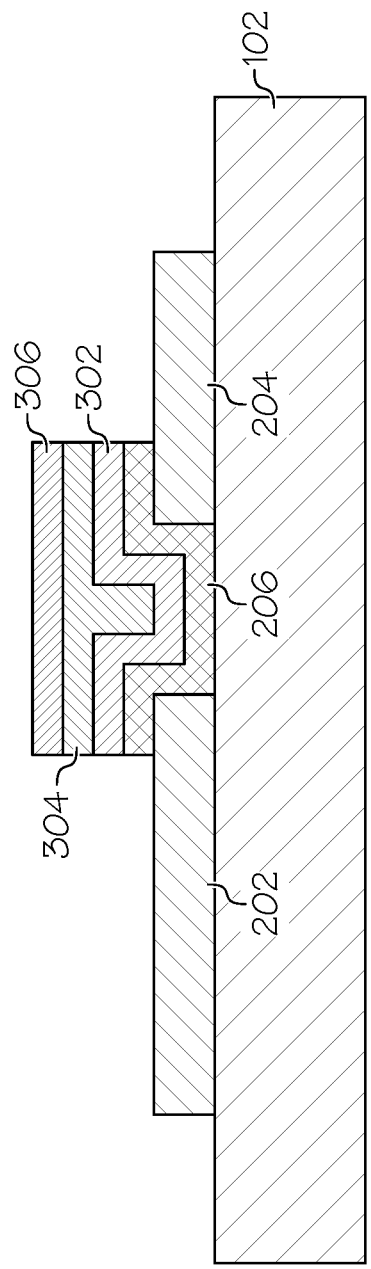
FIG. 5 is a cross-sectional view of a semiconductor structure after a gate dielectric layer and thin-film semiconductor layer have been pattered according to one embodiment of the present invention.

FIG. 4 shows that an etching process such as RIE may be performed to remove any exposed portions of gate metal material(s) 304 and hard mask 306 that do not underlie the patterning mask 308. This process leaves a portion of the gate metal material(s) 304 (herein referred to as "gate metal layer 304") under the mask 308 The patterning mask 308 may then be removed, as shown in FIG. 5. The patterning mask 308 may be removed using, for example, an oxygen plasma based ashing process, a wet chemical stripping process, a solvent process, or any other applicable process.

FIG. 5 also shows that fabrication of the transistor layers is completed by removing exposed portions of the gate dielectric material(s) 302 and thin-film semiconductor material(s) 206 that do not underlie the patterned portions of the gate metal layer(s) 304 and hard mask 306. For example, patterned portions of the gate metal layer(s) 304 and hard mask layer 306 enable a self-aligned gate dielectric etch process to be performed using, for example, RIE. This etching process removes exposed portions of the gate dielectric layer(s) 302 that do not underlie the patterned gate stack; exposes portions of the thin-film semiconductor layer(s) 206; and leaves a portion of the gate dielectric material(s) 302 (herein referred to as "gate dielectric layer 304) under the gate metal layer 302. The resulting patterned stack further enables a self-aligned thin-film semiconductor etch process to be performed using, for example, RIE. This etching process removes exposed portions of the thin-film semiconductor layer(s) 206 that do not underlie the pattern stack; exposes portions of the source/drain regions 202, 204; leaves a portion of the gate thin-film semiconductor material(s) 206 (herein referred to as "thin-film semiconductor layer 206") under the gate dielectric layer 304.

Figure 6:
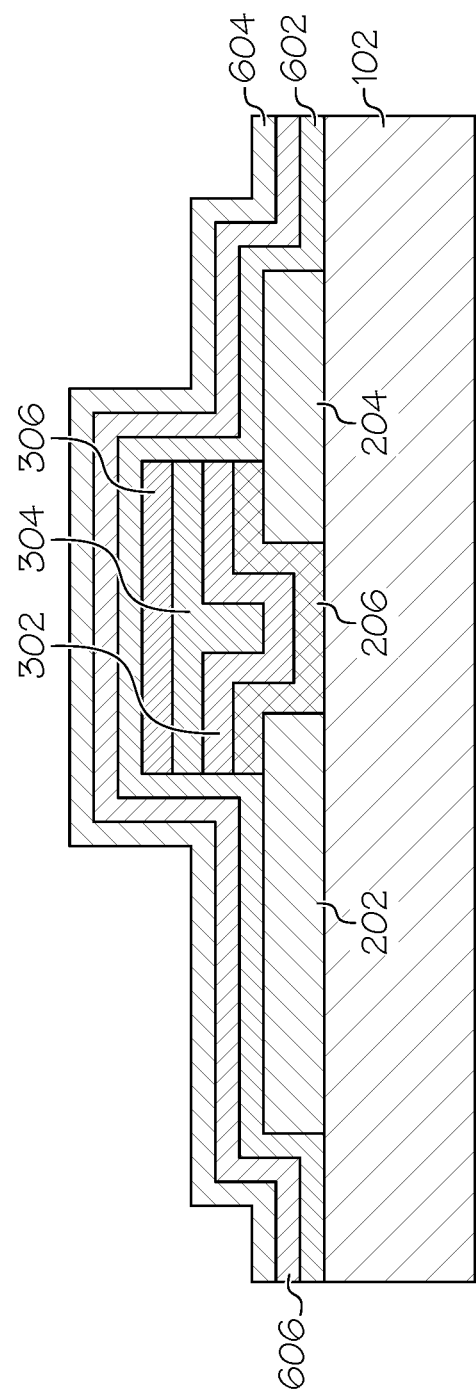
FIG. 6 is a cross-sectional view of a semiconductor structure after magnetic tunnel junction layers have been formed over the structure according to one embodiment of the present invention.

MTJ stack layers 602, 604, 606 may then be formed on the entire structure, as shown in FIG. 6. The MTJ layers comprises two magnetic layers 602, 604 that are separated by an insulating layer 606 referred to as a tunnel barrier. The first magnetic layer 602 is formed on and in contact with the substrate 102; source/drain regions 202, 204; sidewalls of the thin-film semiconductor layer 206; sidewalls of the gate dielectric layer 302; sidewalls of the gate metal layer 304;

sidewalls of the hard mask 306; and a top surface of the hard mask 306. The insulating layer 606 is then deposited over and in contact with the first magnetic layer 602. The second magnetic layer 604 is then deposited over and in contact with the insulating layer 606. The first and second magnetic layers 602, 604 may comprise a magnetic material such as, but not limited to, cobalt (Co), iron (Fe), boron (B a, CoFeB alloys, Co/Pt multilayers, Co/Ni multilayers, similar ferromagnetic multilayer materials or alloys with transition metals or rare earth metals, any combination thereof, and/or the like. The insulating layer 606 may comprise materials such as, but not limited to, magnesium oxide (MgO), aluminum oxide (AlOx), and/or the like.

One of the magnetic layers 602, 604 has a high level of magnetization and is fixed/pinned (reference layer). The other magnetic layer 602, 604 has a lower amount of magnetization and is referred to as the free layer (i.e., not pinned). The free layer is able to rotate its magnetization to be parallel with the pinned layer or anti-parallel to the pinned layer. Parallel magnetizations allow current to tunnel through the tunnel barrier resulting in low resistance. Anti-parallel magnetizations do not allow current to tunnel through the tunnel barrier resulting in high resistance. The magnetizations can be controlled either by passing current through a different copper line so that the current induces a magnetic field that interacts with the free layer or by directly injecting spin polarized current into the device which produces a torque on the magnetic free layer.

Figure 7:
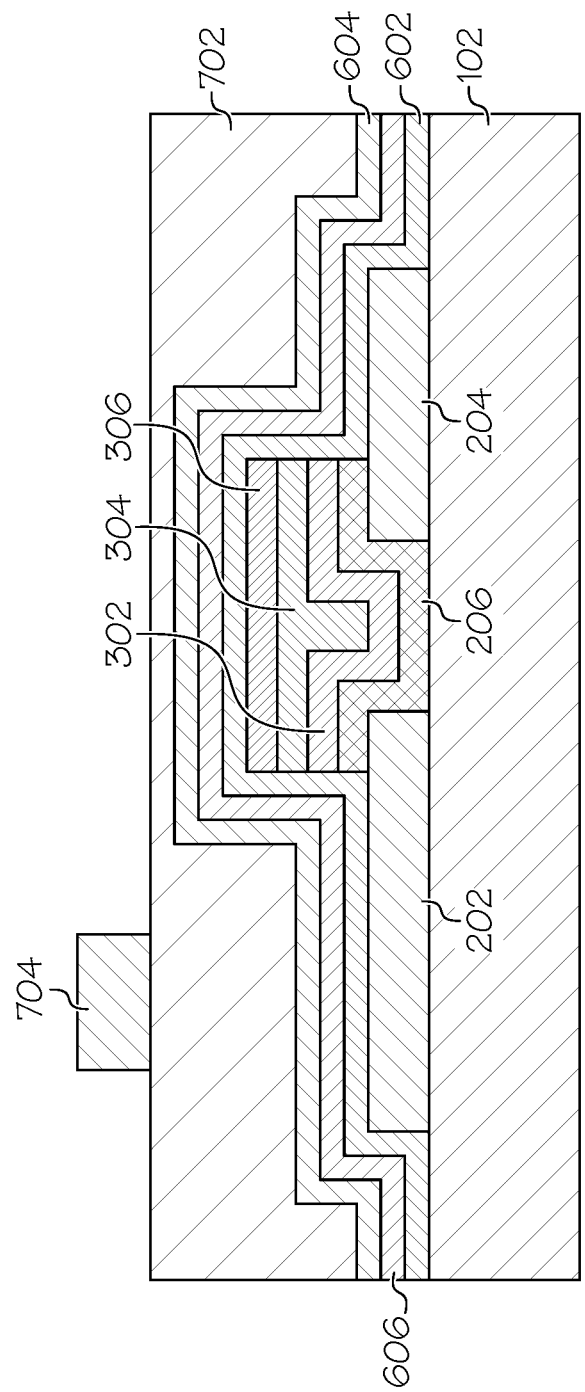
FIG. 7 is a cross-sectional view of a semiconductor structure after an optical planarization layer has been formed over the structure according to one embodiment of the present invention.

An optical planarization layer (OPL) 702 is the formed over the structure, as shown in FIG. 7. The OPL 702 provides a planar surface for patterning a MTJ stack from the MTJ layers 602, 604, 606. A patterning mask 704 is formed in contact with the OPL 702 over a portion of the MTJ layers 602, 604, 606 that are to form the MTJ stack. The patterning mask 704 may be a soft mask such as photoresist, optical planarization layer (OPL), or a hardmask (e.g., oxide). The patterning mask may be formed by deposition of the mask layer, performing photo lithography process, and followed by etching. Other suitable techniques, such as sidewall image transfer (SIT), self-aligned double patterning (SADP), self-aligned multiple patterning (SAMP), self-aligned quadruple patterning (SAQP) may also be used to form the patterning mask 704.

Figure 8:
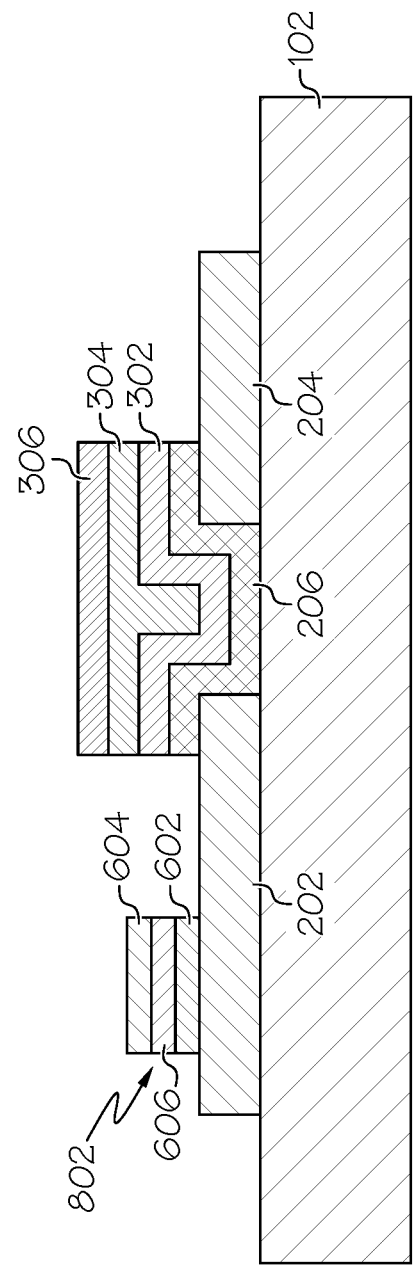
FIG. 8 is a cross-sectional view of a semiconductor structure after a magnetic tunnel junction stack has been patterned according to one embodiment of the present invention.

One or more etching processes are performed to remove portions of the OPL 702 and the MTJ layers 602, 604, 606 that do not underlie the patterning mask 704. The hard mask 306 protects the transistor gate stack during this etching process. The patterning mask 704 and the remaining OPL 702 underlying the mask 704 are subsequently removed using one or more etching/stripping processes. These processes result in the formation of a MTJ stack 802, which comprises the patterned portions of the MTJ layers 602 to 606, in contact with a portion of the source region 202. FIG. 8 also shows that portions of the source/drain regions 202, 204; thin-film semiconductor layer 206; gate dielectric layer 302; gate metal layer 406; and hard mask 306 are now exposed.

Figure 9:
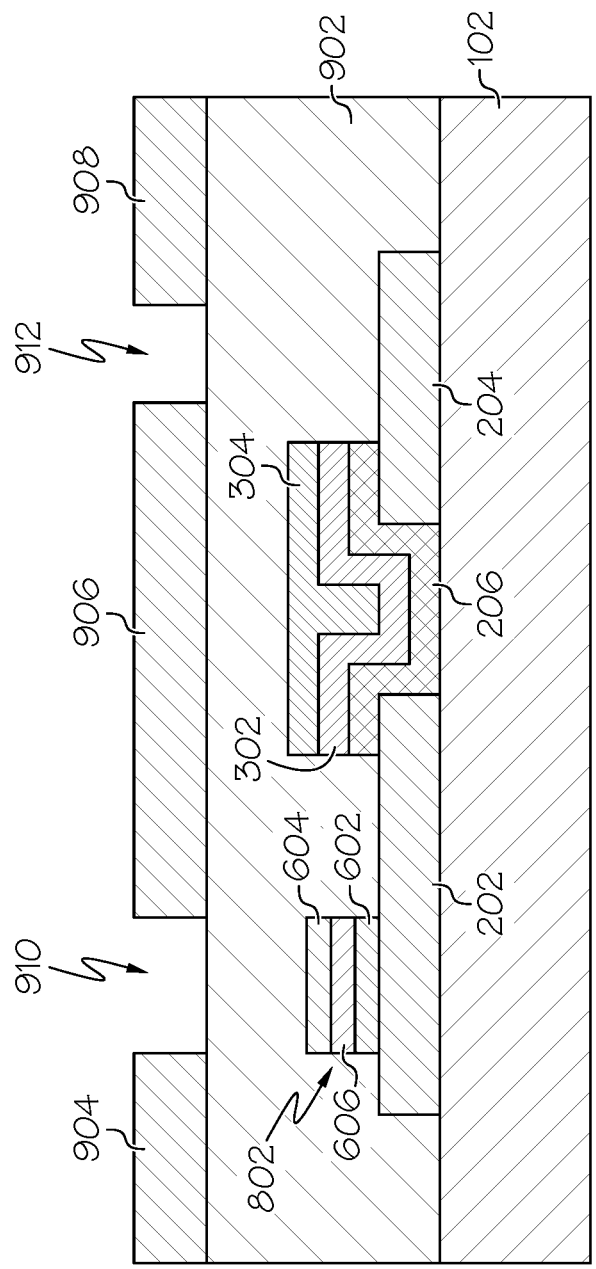
FIG. 9 is a cross-sectional view of a semiconductor structure after an interlayer dielectric and patterning masks have been formed according to one embodiment of the present invention.

FIG. 9 shows that the gate hard mask 306 is removed using one or more etching/stripping processes followed by a deposition of an inter-layer dielectric (ILD) 902. The ILD 902 extends above the top surface of the formed features and has a planar top surface. FIG. 9 also shows that a plurality of patterning masks 904 to 908 have been formed in contact with the ILD 902. The patterning masks 904 to 908 may be a soft mask such as photoresist, optical planarization layer (OPL), or a hardmask (e.g., oxide). The patterning mask may be formed by deposition of the mask layer, performing photo lithography process, and followed by etching. The patterning masks 904 to 908 define openings 910, 912 over the MTJ stack 802 and a portion of the drain region 204 through which source/drain contact trenches will be formed.

Figure 10:
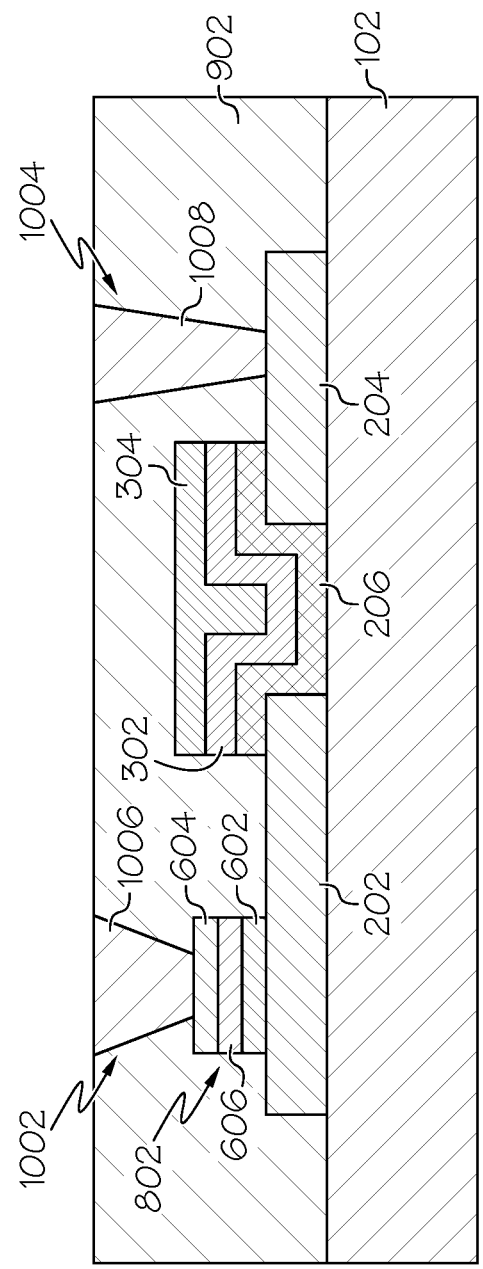
FIG. 10 is a cross-sectional view of a semiconductor structure after bit line contacts have been formed according to one embodiment of the present invention.

FIG. 10 shows that one or more etching processes such as RIE are performed to remove the portions of the ILD 902 within the openings 910, 912 to form contact trenches 1002, 1004. The contact trenches 1002, 1004 expose a top surface of the MTJ stack 802 and a top surface of a portion of the drain region 204. In some embodiments, the nature of the etching results in the contact trenches 1002, 1004 having tapered walls. The patterning masks 904 to 908 may then be removed using an etching/stripping process. FIG. 10 also shows that a conductive material is then deposited into the trenches 1002, 1004 to form first and second contacts 1006, 1008, which may be referred to as "bit line contact 1006" and "bit line complement contact 1008", respectfully. The first bit line contact 1006 contacts the top layer 604 of the MTJ stack 802, and the second bit line contact 1008 contacts the exposed surface of the drain region 204. The contacts 1006, 1008 may be formed using a process such as CVD, PVD, ALD; electroplating processes; or some combination of these processes. The conductive metal may include, but is not limited to, tungsten, copper, aluminum, silver, gold, and alloys thereof. A planarization process such as chemical-mechanical planarization (CMP) may then be performed to remove excess conductive metal material such that the top surface of the contacts 1006, 1008 and the top surface of the ILD 902 are co-planar.

Figure 11:
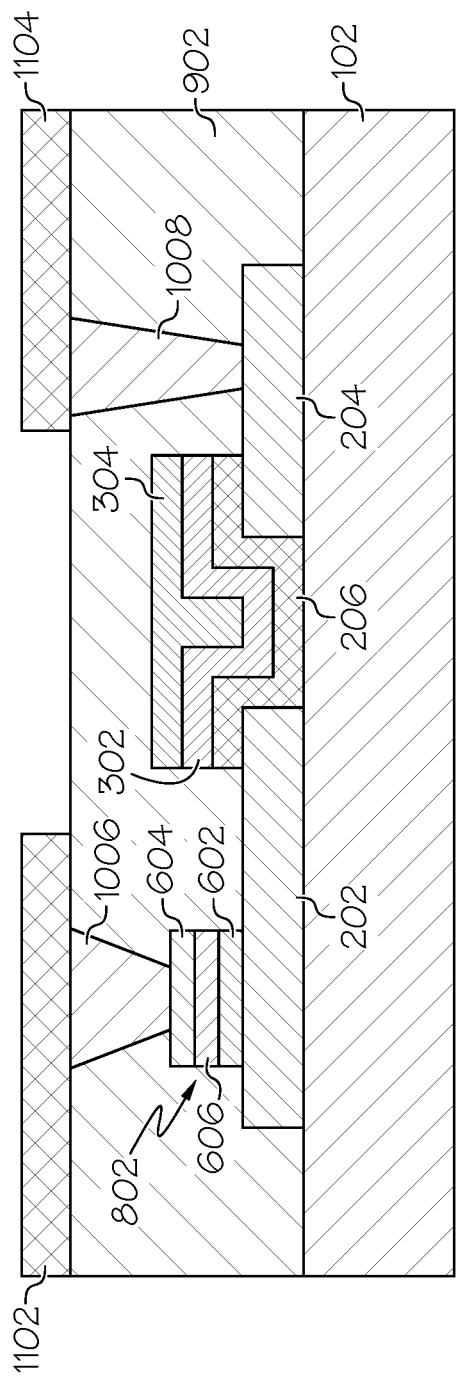
FIG. 11 is a cross-sectional view of a semiconductor structure after bit line metal layers have been formed according to one embodiment of the present invention.

Interconnect metal layers 1102, 1104 are then formed on and in contact with the top surface of the ILD 902 and contacts 1006, 1008 as shown in FIG. 11. The interconnect metal layers 1102, 1104 are patterned using one or more patterning techniques such that an interconnect metal material is patterned into a plurality of interconnect metal layers 1102, 1104, which may be referred to as "bit line metal layers"). A first bit line metal layer 1102 is in contact with the first bit line contact 1006 and a first portion of the ILD 902. A second bit line metal layer 1104 is in contact with the second bit line contact 1008 and a second portion of the ILD 902. The bit line metal layers 1102, 1104 may be composed of copper (Cu), tungsten (W), aluminum (Al), molybdenum (Mo), ruthenium (Ru), gold (Au), cobalt (Co), nickel (Ni), combinations thereof, or any other applicable materials.

Figure 12:
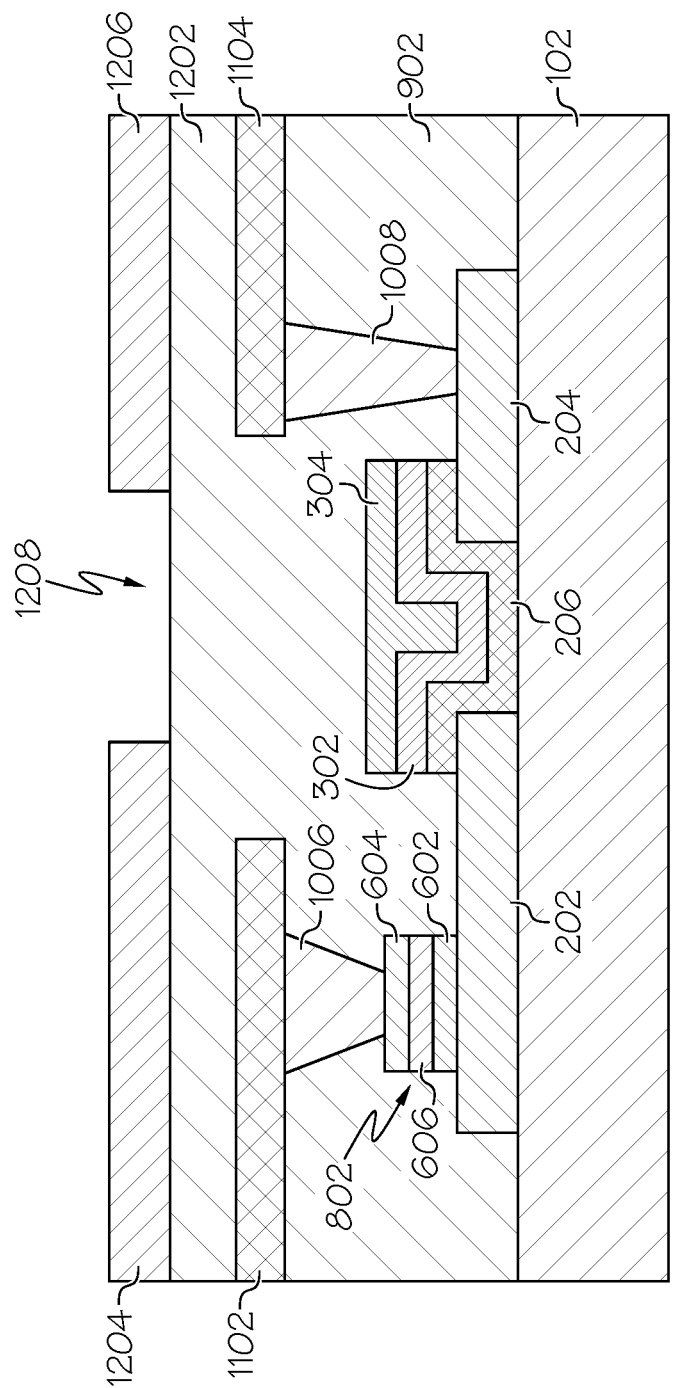
FIG. 12 is a cross-sectional view of a semiconductor structure after an interlayer dielectric has been formed over the structure according to one embodiment of the present invention.

FIG. 12 shows that an additional ILD 1202 may then be deposited over the structure covering the bit line metal layers 1102, 1104. The additional ILD 1202 fills in the gap between the bit line metal layers 1102, 1104. The additional ILD 1202 extends above the top surface of the formed features and has a planar top surface. Patterning masks 1204, 1206 are formed on top and in contact with the additional ILD layer 1202 over portions of the structure not underlying the transistor stack. An area 1208 between the masks situated over at least a portion of the transistor gate is left unmasked. The patterning masks 1204, 1206 may be a soft mask such as photoresist, optical planarization layer (OPL), or a hardmask (e.g., oxide). The patterning masks may be formed by deposition of the mask layer, performing photo lithography process, and followed by etching.

Figure 13:
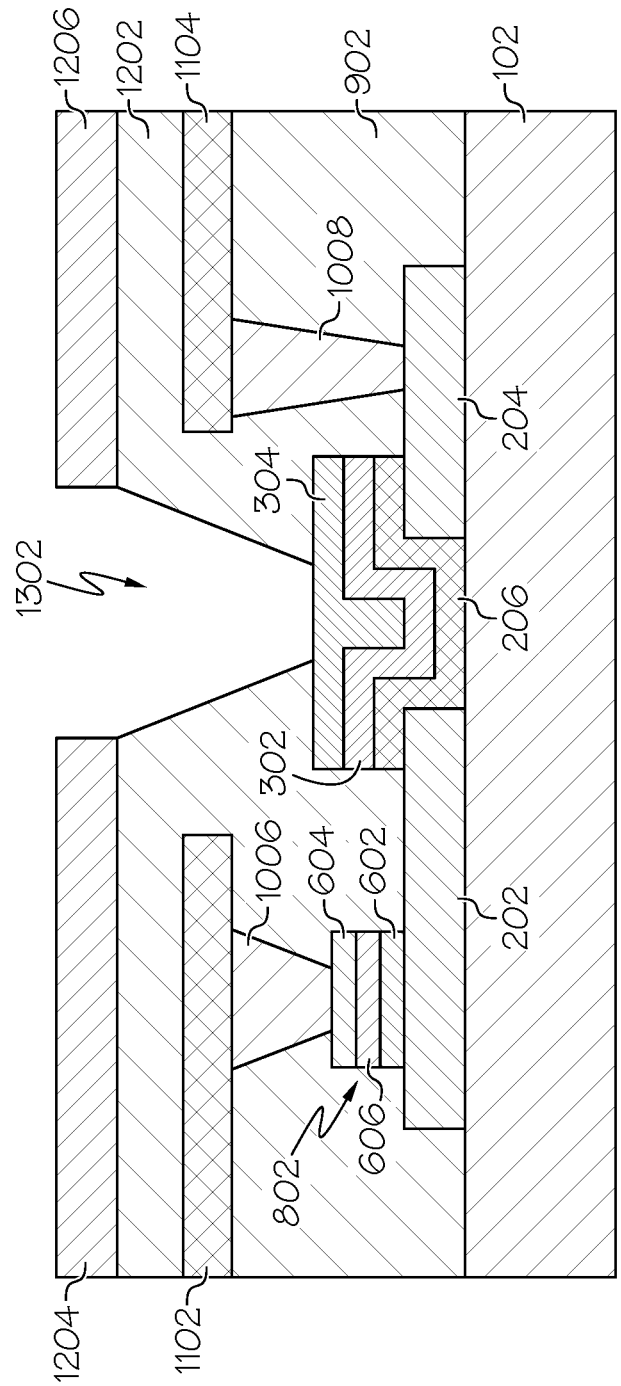
FIG. 13 is a cross-sectional view of a semiconductor structure after a gate contact trench has been formed according to one embodiment of the present invention.
Figure 14:
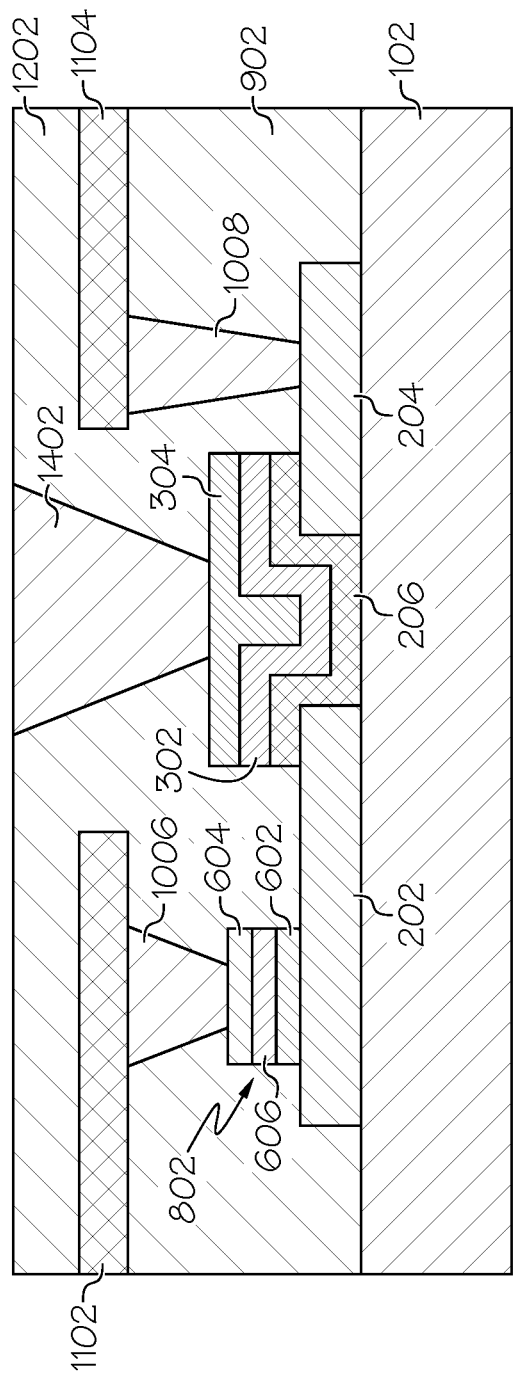
FIG. 14 is a cross-sectional view of a semiconductor structure after a word line contact has been formed in contact with the gate according to one embodiment of the present invention.

FIG. 13 shows that one or more etching processes such as RIE are performed to remove the unmasked portions of the additional ILD 1202 and to form a gate contact trench 1302. The gate contact trench 1302 exposes at least a portion of the top surface of the gate metal layer 304. In some embodiments, the nature of the etching results in the gate contact trench 1302 having tapered walls. The patterning masks 1204, 1206 may then be removed using an etching/stripping process. FIG. 14 shows that a conductive material is then deposited into the gate contact trench 1302 to form a gate contact 1402, which may also be referred to as "word line contact 1402". The word line contact 1402 contacts the exposed portion of the top surface of the gate metal layer 304. The word line contact 1402 may be formed using a process such as CVD, PVD; electroplating processes; or some combination of these processes. The conductive metal may include, but is not limited to, tungsten, copper, aluminum, silver, gold, and alloys thereof. A planarization process may then be performed to remove excess conductive metal material such that the top surface of the word line contact 402 and the top surface of the additional ILD 1202 are co-planar.

Figure 15:
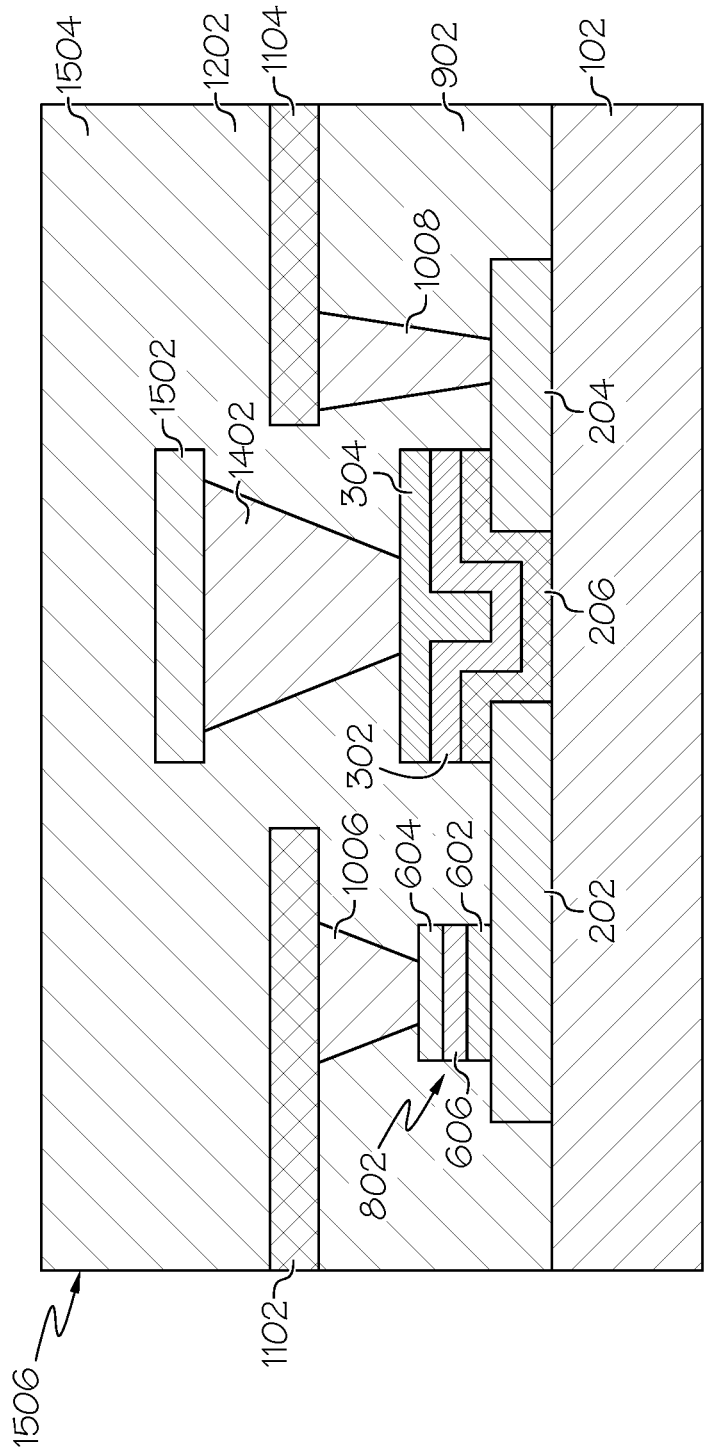
FIG. 15 is a cross-sectional view of a semiconductor structure after completion of a transistor-MRAM unit cell according to one embodiment of the present invention.

An interconnect metal layer 1502 (also referred to as "word line metal layer 1502") may then be formed on and in contact with the top surface of the word line contact 1402 as shown in FIG. 15. In some embodiments, the word line metal layer 1502 may also contact the top surface of a portion of the ILD 1202. The word line metal layer 1502 is patterned using one or more patterning techniques. The word line metal layer 1502 may be composed of copper (Cu), tungsten (W), aluminum (Al), molybdenum (Mo), ruthenium (Ru), gold (Au), cobalt (Co), nickel (Ni), combinations thereof, or any other applicable materials. FIG. 15 also shows an additional ILD 1504 may then be deposited over the structure covering the word line metal layer 1502. The additional ILD 1504 extends above the top surface of word line metal layer 1502. The resulting structure may be referred to as a planar 1T(transistor)-1MRAM cell 1506.

Figure 16:
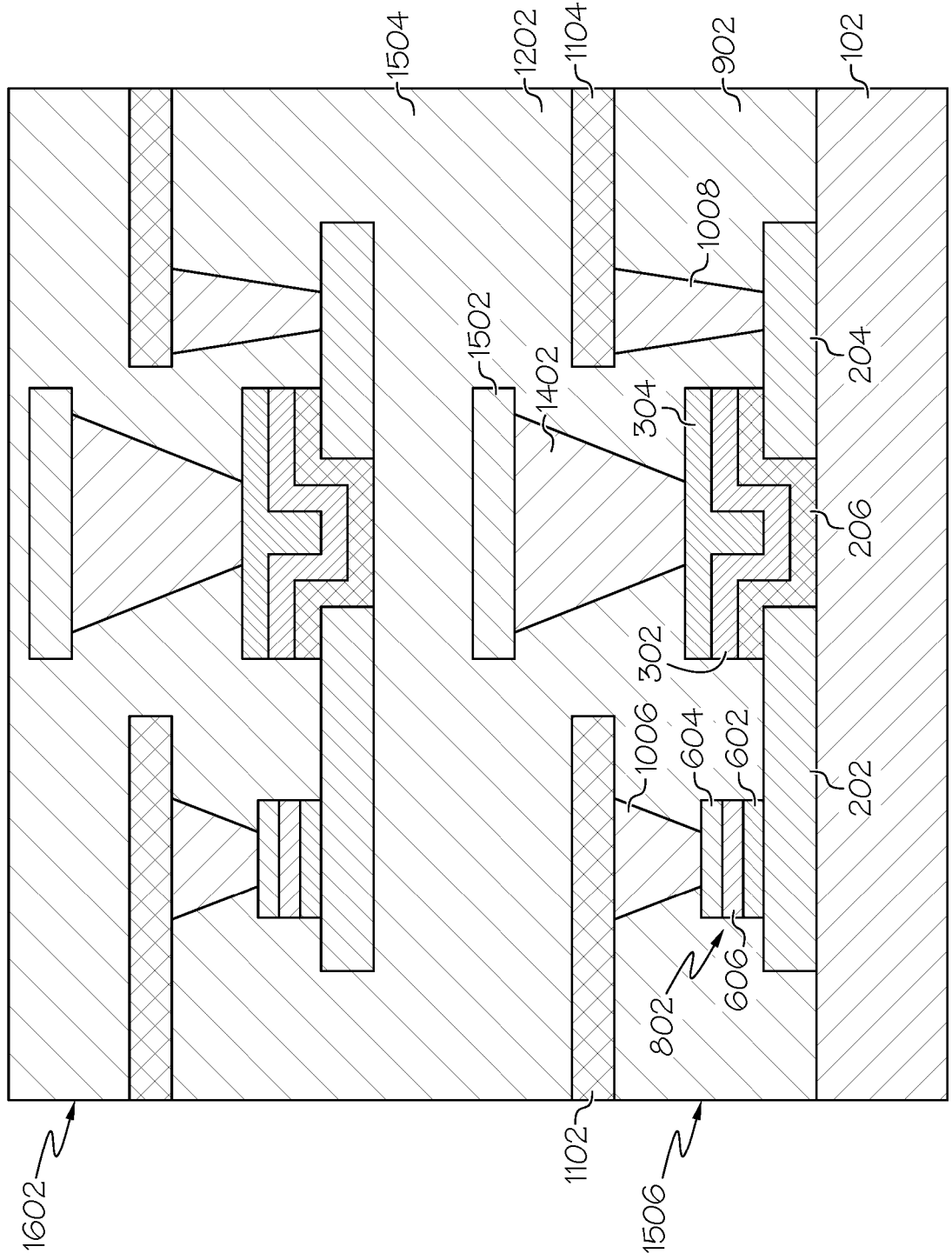
FIG. 16 is a cross-sectional view of a semiconductor structure after an additional second transistor-MRAM unit cell has been formed above the transistor-MRAM unit cell of FIG. 15 according to one embodiment of the present invention.

As discussed above, one advantage of embodiments invention is that since the layout of the 1T-1MRAM unit cell is planar multiple planar 1T-1MRAM unit cells may be stack on top of each other with an ILD disposed between each cell. For example, the fabrication processes discussed above with respect to FIGS. 1-15 may be repeated one or more times to build a stack structure of multiple planar MRAM thin-film transistor unit cells, as shown in FIG. 16. It should be noted that although FIG. 16 shows a two-level cell structure embodiments of the present invention are applicable to any number of levels. In the embodiment shown in FIG. 16, ILD layer 1504 completely separates the first 1T-1MRAM unit cell 1506 from the second 1T-1MRAM cell 1602. In at least some embodiments, the features of the second 1T-1MRAM unit cell 1602 are disposed above and aligned with their corresponding features in the first 1T-1MRAM unit cell 1506.

Figure 17:
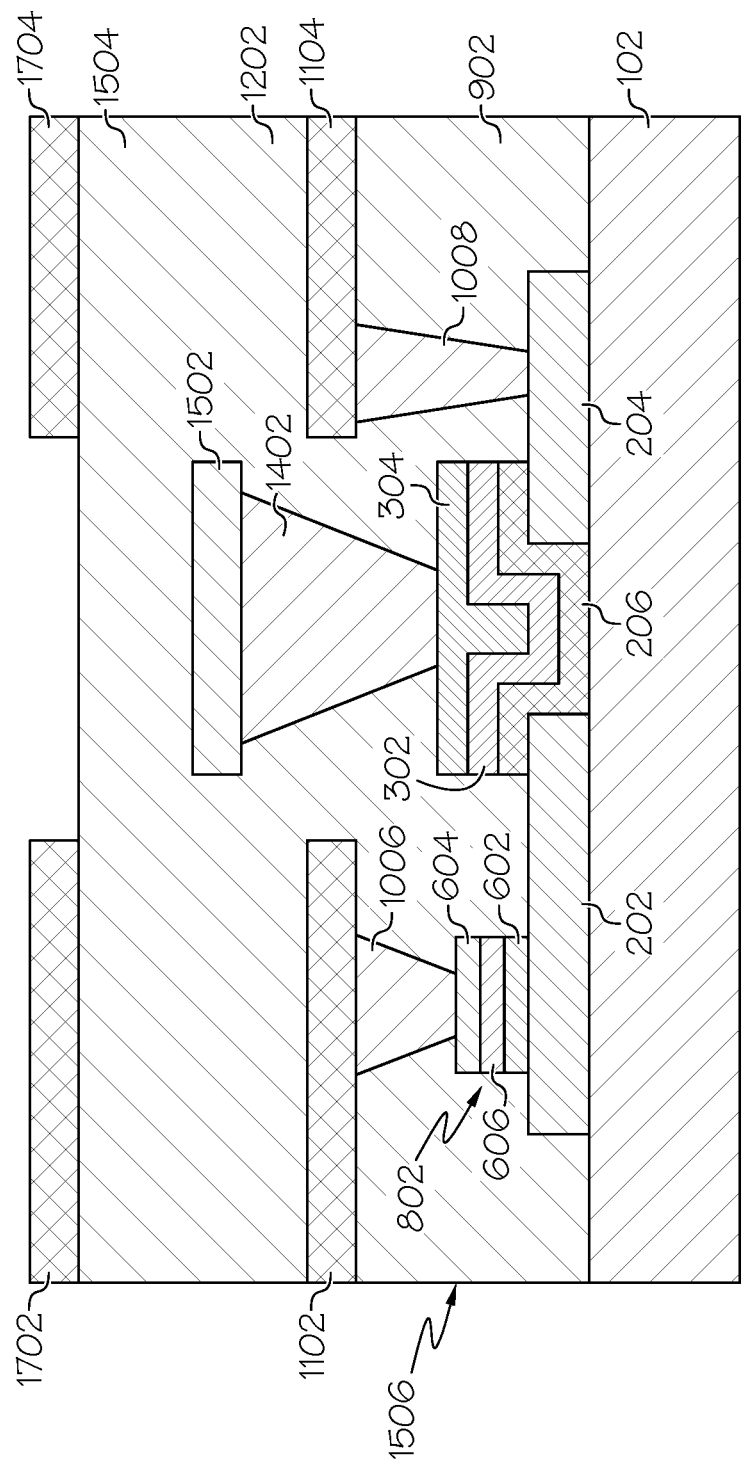
FIG. 17 is a cross-sectional view of a semiconductor structure after additional bit line metal layers have been formed above the transistor-MRAM unit cell of FIG. 15 according to one embodiment of the present invention.

In another embodiment, one or more pairs of stacked 1T-1MRAM unit cells share a common word line metal layer. For example, FIG. 17 shows that after a first 1T-1MRAM unit cell 1506 has been fabricated additional bit line metal layers 1702, 1704 are formed in contact with the ILD 1504 similar to the bit line metal layers 1102, 1104 discussed above with respect to FIG. 11. In some embodiments, the locations of the bit line metal layers 1702, 1704 are aligned with the corresponding bit line metal layers 1102, 1104 of the lower 1T-1MRAM unit cell 1506.

Figure 18:
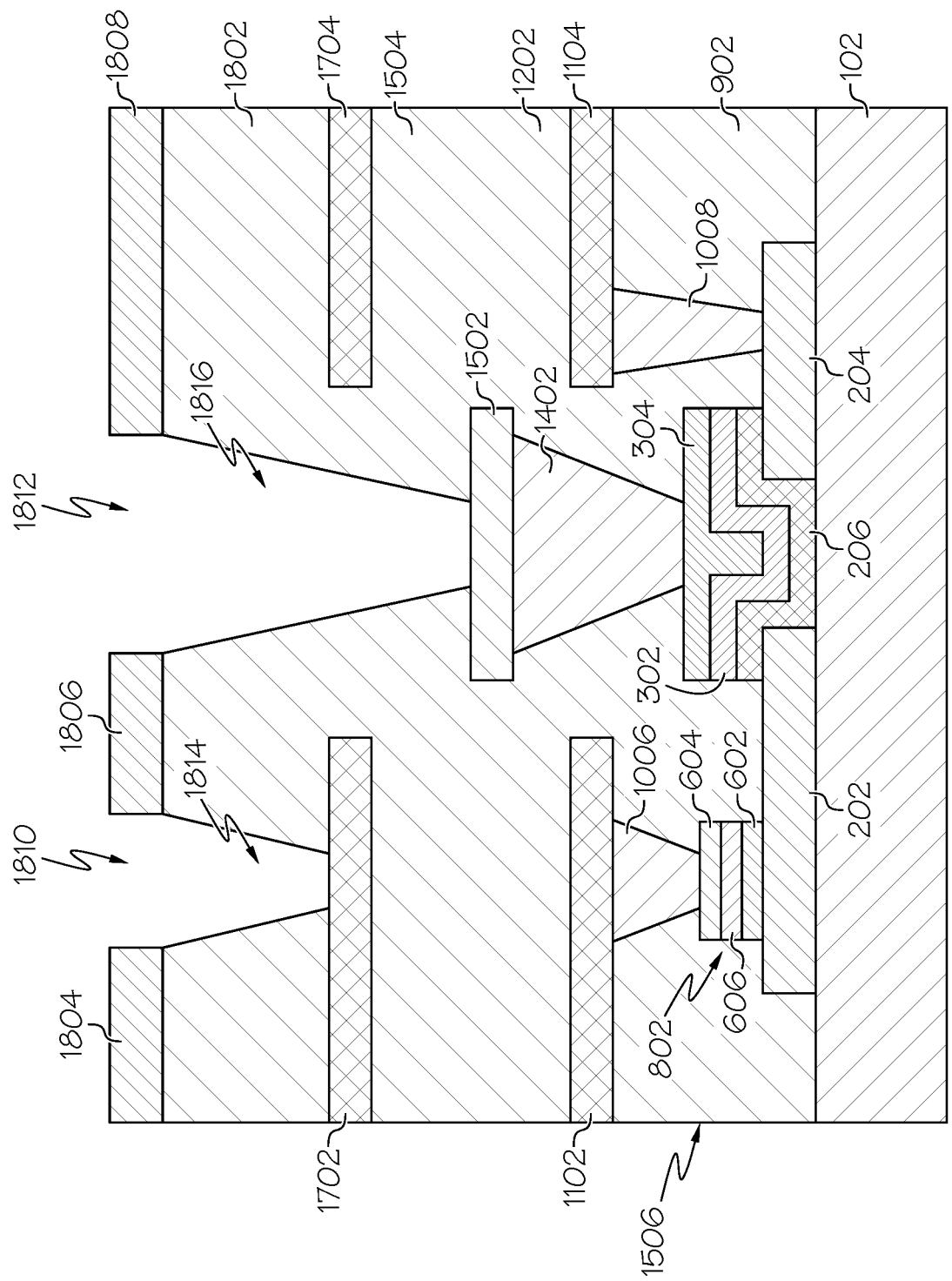
FIG. 18 is a cross-sectional view of a semiconductor structure after an interlayer dielectric has been deposited over the structure and contact trenches have been formed to expose the word line metal level and at least one of the additional bit line metal layers according to one embodiment of the present invention.

FIG. 18 shows that after the bit line metal layers 1702, 1704 have been formed an additional ILD layer 1802 may be deposited over the structure covering the bit line metal layers 1702, 1704. The additional ILD 1802 fills in the gap between the bit line metal layers 1702, 1704. The additional ILD 1802 extends above the top surface of the formed features and has a planar top surface. Patterning masks 1804 to 1808 are formed on top and in contact with portions of the additional ILD layer 1802 to define openings 1810, 1812 where contact trenches are to be made. The patterning masks 1804 to 1808 may be a soft mask such as photoresist, optical planarization layer (OPL), or a hardmask (e.g., oxide). The patterning masks 1804 to 1808 may be formed by deposition of the mask layer, performing photo lithography process, and followed by etching.

One or more etching processes such as RIE are performed to remove the unmasked portions of the additional ILD 1802 to form contact trenches 1814, 1816. A first contact trench 1814 exposes at least a portion of the top surface of one of the bit line metal layers 1702. In one embodiment, the exposed interconnect bit line layers 1702 is situated over the source region 202 of the lower 1T-1MRAM unit cell 1506. A second contact trench 1816 exposes at least a portion of the top surface of the word line metal layer 1502.

Figure 19:
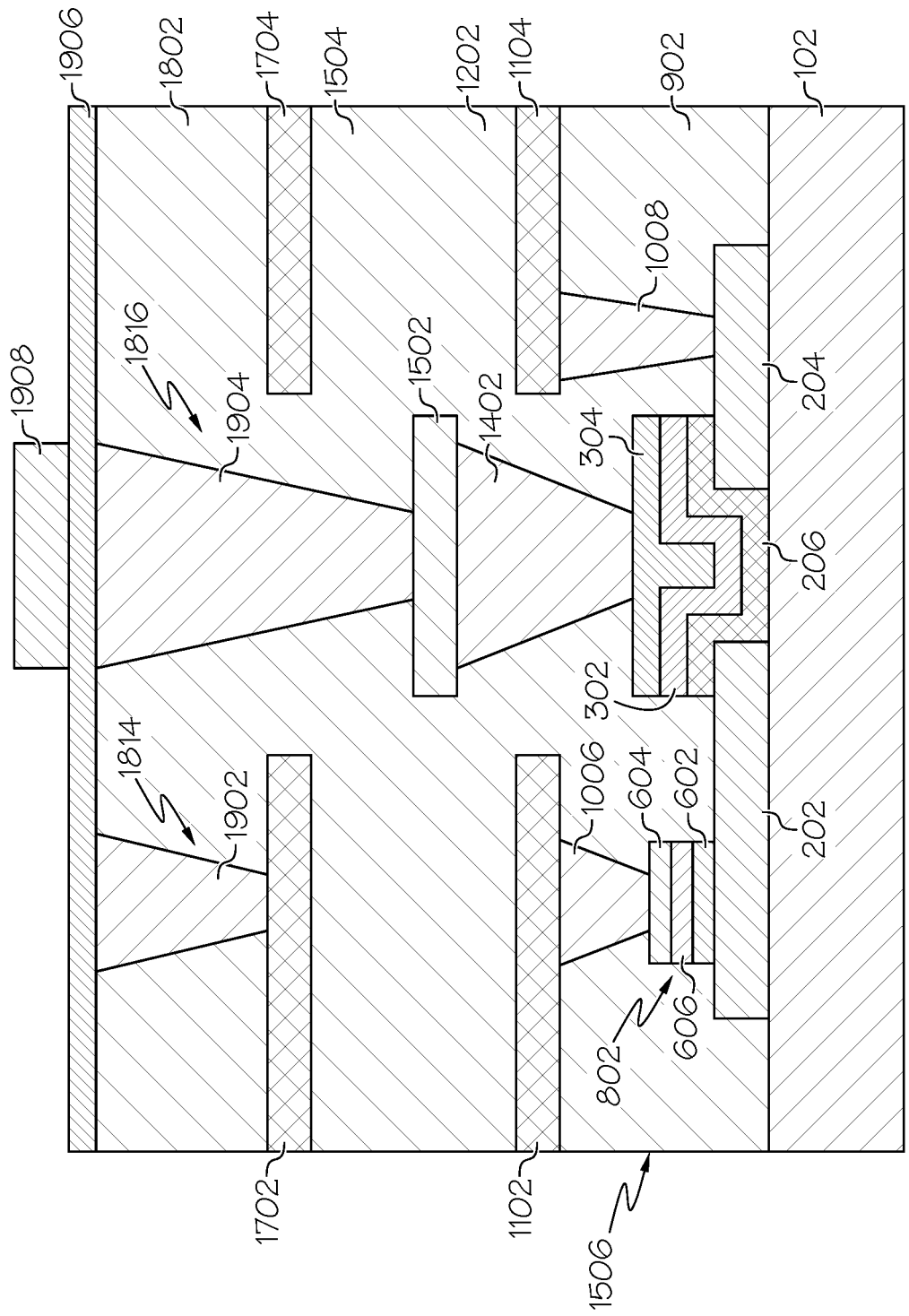
FIG. 19 is a cross-sectional view of a semiconductor structure after the formation of an additional bit line contact and an additional word line contact has according to one embodiment of the present invention.

In some embodiments, the nature of the etching results in the contact trenches 1814, 1816 having tapered walls. The patterning masks 1804, 1808 may then be removed using an etching/stripping process. FIG. 19 shows that a conductive material is deposited into the contact trenches 1814, 1816 to form a bit line contact 1902 and a word line contact 1904. The bit line contact 1902 contacts the exposed portion of the top surface of bit line metal layer 1702. The word line contact 1904 contacts the exposed portion of the top surface of word line metal layer 1502. In this embodiment, the word line metal layer 1502 is shared between word line metal contacts 1402, 1904 of both 1T-1MRAM unit cells. The contacts 1902, 1904 may be formed using a process such as CVD, PVD, ALD; electroplating processes; or some combination of these processes. The conductive metal may include, but is not limited to, tungsten, copper, aluminum, silver, gold, and alloys thereof. A planarization process may then be performed to remove excess conductive metal material such that the top surface of the contacts 1902, 1904 and the top surface of the additional ILD 1802 are co-planar.

Figure 20:
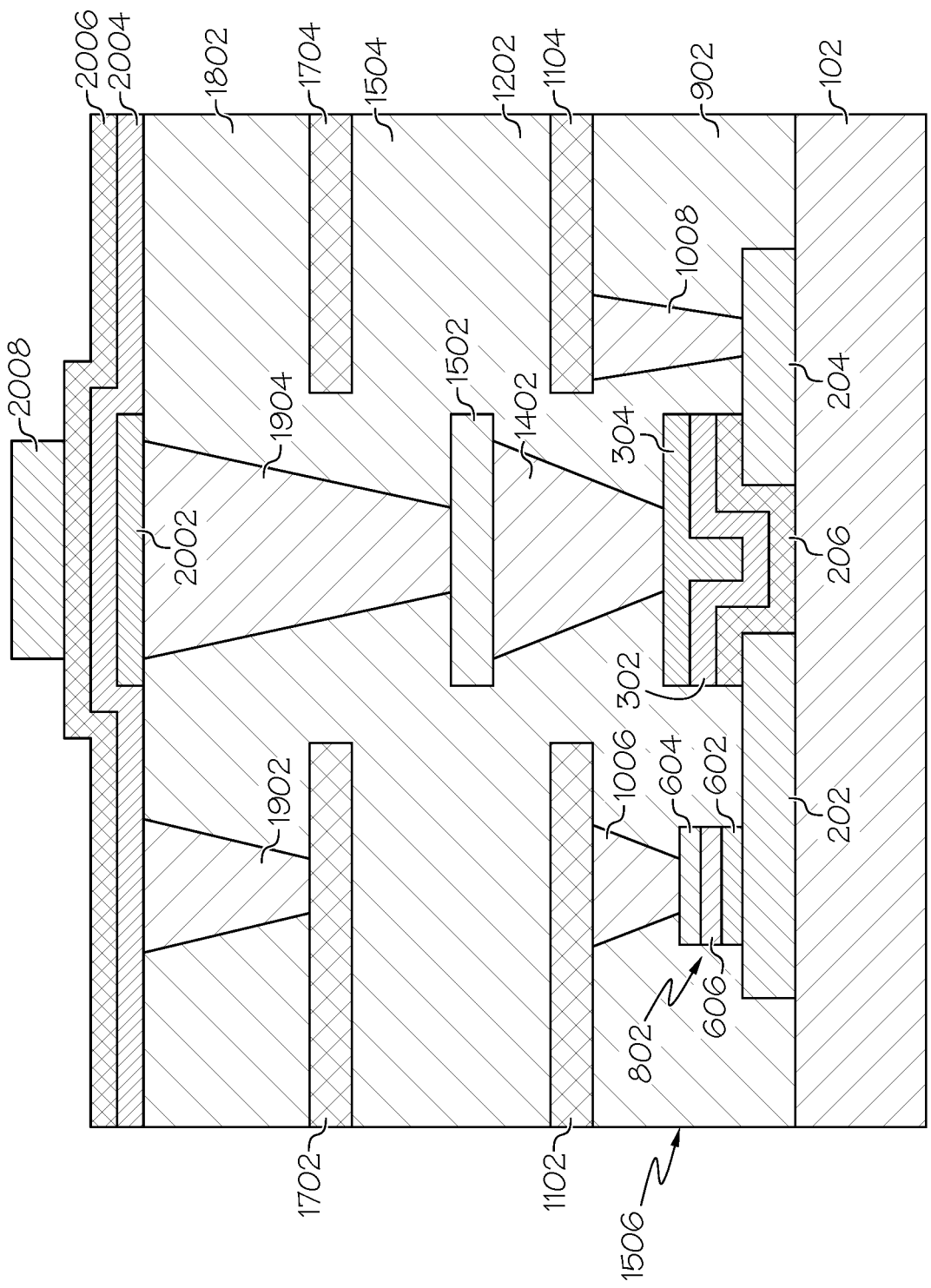
FIG. 20 is a cross-sectional view of a semiconductor structure after additional thin-film transistor layers have been formed according to one embodiment of the present invention.

One or more gate metal materials 1906 are deposited over the structure in contact with the top surface of ILD layer 1802 and contacts 1902, 1904. The gate metal material(s) 1906 may be similar to the gate metal material(s) 1906 discussed above with respect to FIG. 3. After the one or more gate metal materials 1906 have been deposited, a patterning mask 1908 may be formed over and in contact with the gate metal material(s) 1906. Exposed portions of gate metal material(s) 1906 not underlying the mask 1908 may then be removed to form a gate metal layer 2002 from the gate metal layer 1906, as shown in FIG. 20. In one embodiment, the gate metal layer 1906 may be aligned with the gate metal layer 304 of the lower 1T-1MRAM unit cell 1506.

One or more gate dielectric materials 2004 may then deposited over the structure in contact with and conforming to the top surface of the ILD layer 1802, sidewalls and the top surface of the gate metal layer 2002, and a top surface of bit line contact 1902. In some embodiments, ALD may be used to deposit the gate dielectric material 2004 but other deposition processes are applicable as well. One or more thin-film semiconductor materials 2006 may be deposited over the structure in contact with and conforming to the gate dielectric material(s) 2004. The one or more thin-film semiconductor materials 2006 are similar to those discussed above with respect to FIG. 2. A patterning mask 2008 may be formed above the gate metal layer 2002 and in contact with the thin-film semiconductor material(s) 2006 for patterning a gate stack.

Figure 21:
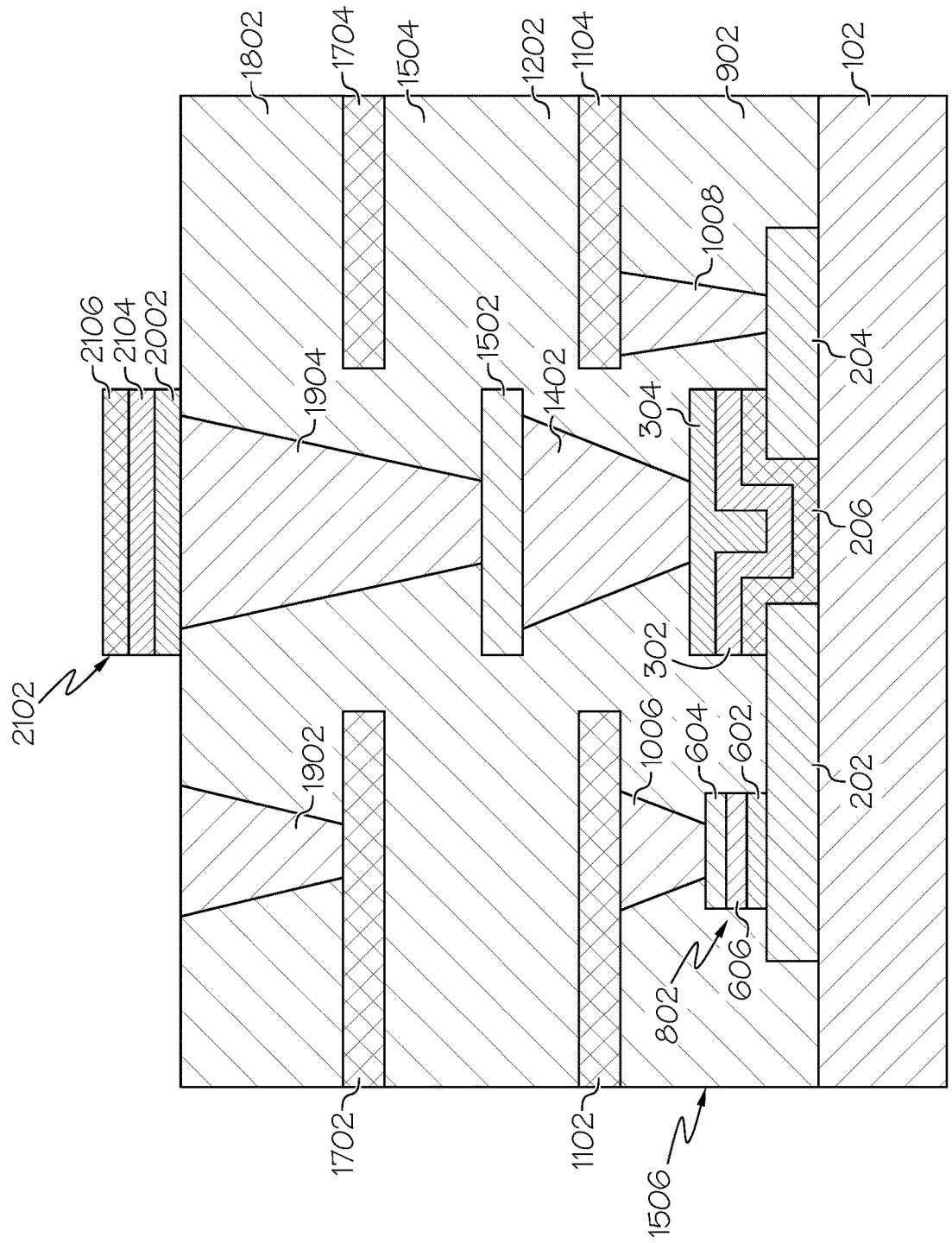
FIG. 21 is a cross-sectional view of a semiconductor structure after a thin-film transistor stack has been formed according to one embodiment of the present invention.

FIG. 21 shows that an etching process such as RIE may be performed to remove any portions of the gate dielectric material(s) 2004 and thin-film semiconductor material(s) 2006 that do not underlie the patterning mask 2008. This process results in a thin-film transistor stack 2102 comprising the metal gate layer 2002, a gate dielectric layer 2104, and a thin-film semiconductor layer 2106. The etching process exposes the top surface of the contacts 1902 and ILD layer 1802. The patterning mask 2008 may then be subsequently removed.

Figure 22:
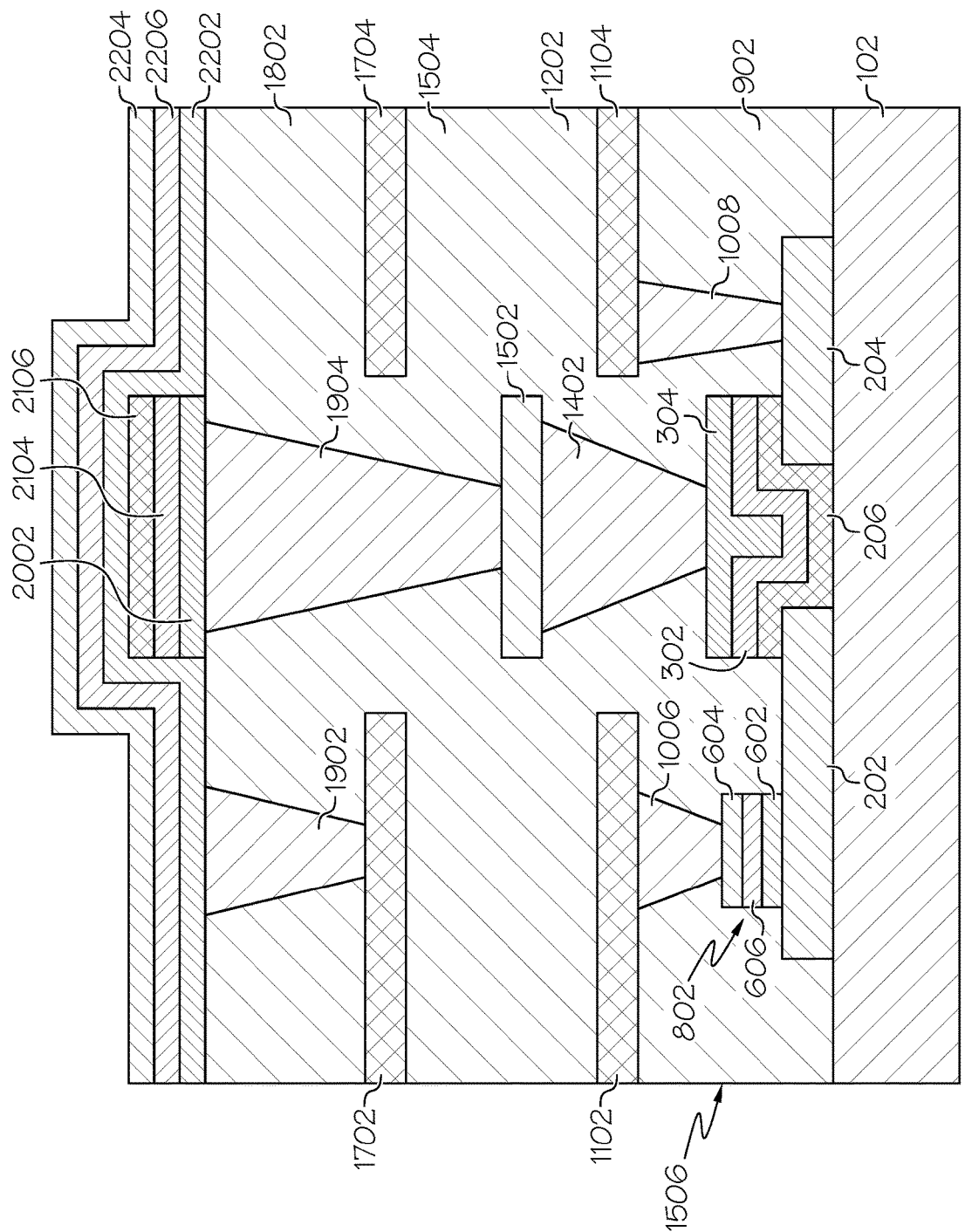
FIG. 22 is a cross-sectional view of a semiconductor structure after magnetic tunnel junction layers have been formed according to one embodiment of the present invention.
Figure 23:
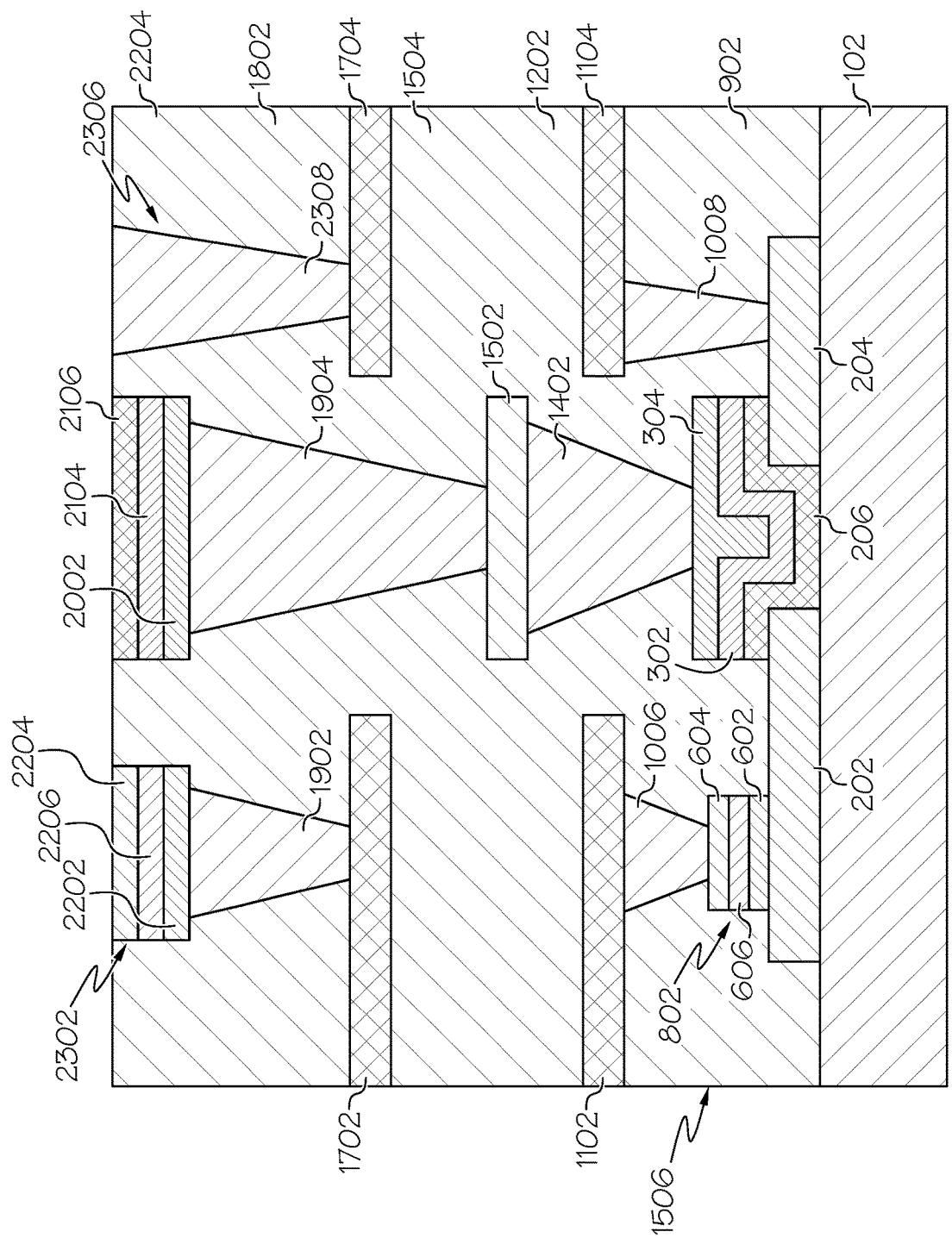
FIG. 23 is a cross-sectional view of a semiconductor structure after a magnetic tunnel junction stack and a bit line complement contact have been formed according to one embodiment of the present invention.

FIG. 22 shows that MTJ stack layers 2202, 2024, 2206 may then be formed on the entire structure similar to the MTJ stack layers 602 to 606 discussed above with respect to FIG. 6. The first magnetic layer 2202 is formed on and in contact with the top surface of the bit line contact 1902, the top surface of ILD layer 1802, sidewalls of the gate metal layer 2002, sidewalls of the gate dielectric layer 2104, sidewalls of the thin-film semiconductor layer 2106, and the top surface of the thin-film semiconductor layer 2106. The MTJ layers 2202, 2204, 2206 may then be patterned to form an MTJ stack 2302, as shown in FIG. 23. The MTJ stack 2302 may be formed using processes similar to those discussed above with respect to FIGS. 7 and 8.

Figure 24:
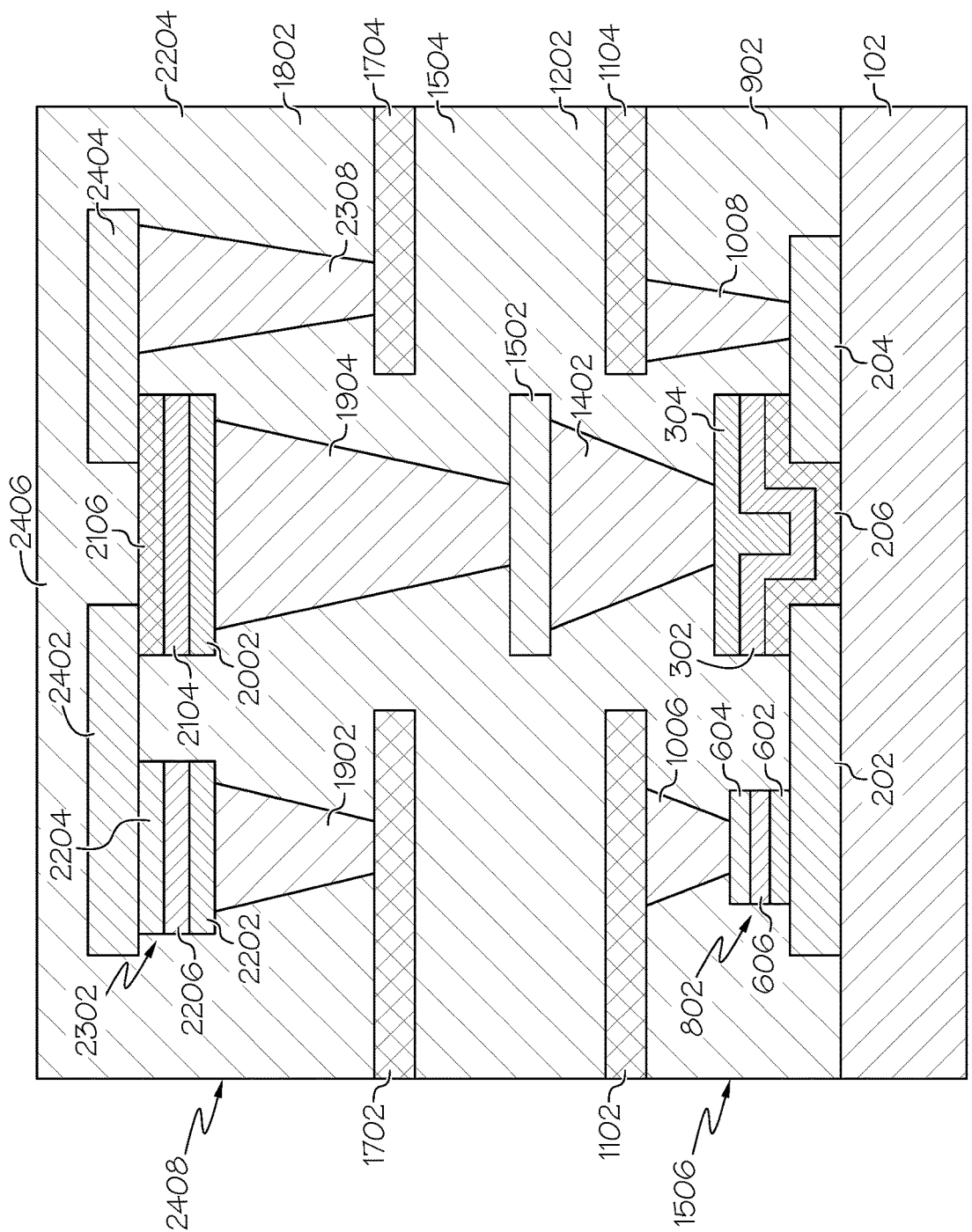
FIG. 24 is a cross-sectional view of a semiconductor structure after completion stacked transistor-MRAM unit cells comprising a shared word line metal layer according to one embodiment of the present invention.

After the MTJ stack 2302 has been form, an additional ILD layer 2304 is formed over the structure and polished down to the top surface of the MTJ stack 2302. A contact trench 2306 is formed and filled with a conductive metal to form a bit line complement contact 2308 using processes similar to those discussed above with respect to FIG. 10. FIG. 24 shows that source and drain regions 2402, 2404 are formed using processes similar to those discussed above with respect to FIGS. 1 and 2. The source region 2402 is formed in contact with the top surface of the MTJ stack 2302, and the top surface of the thin-film semiconductor layer 2106. The drain region 2404 is formed in contact with the top surface of the bit line complement contact 2308 and the top surface of the thin-film semiconductor layer 2106. An additional ILD layer 2406 may then be formed over the structure to complete the current level 1T-1MRAM unit cell 2408.

Figure 25:
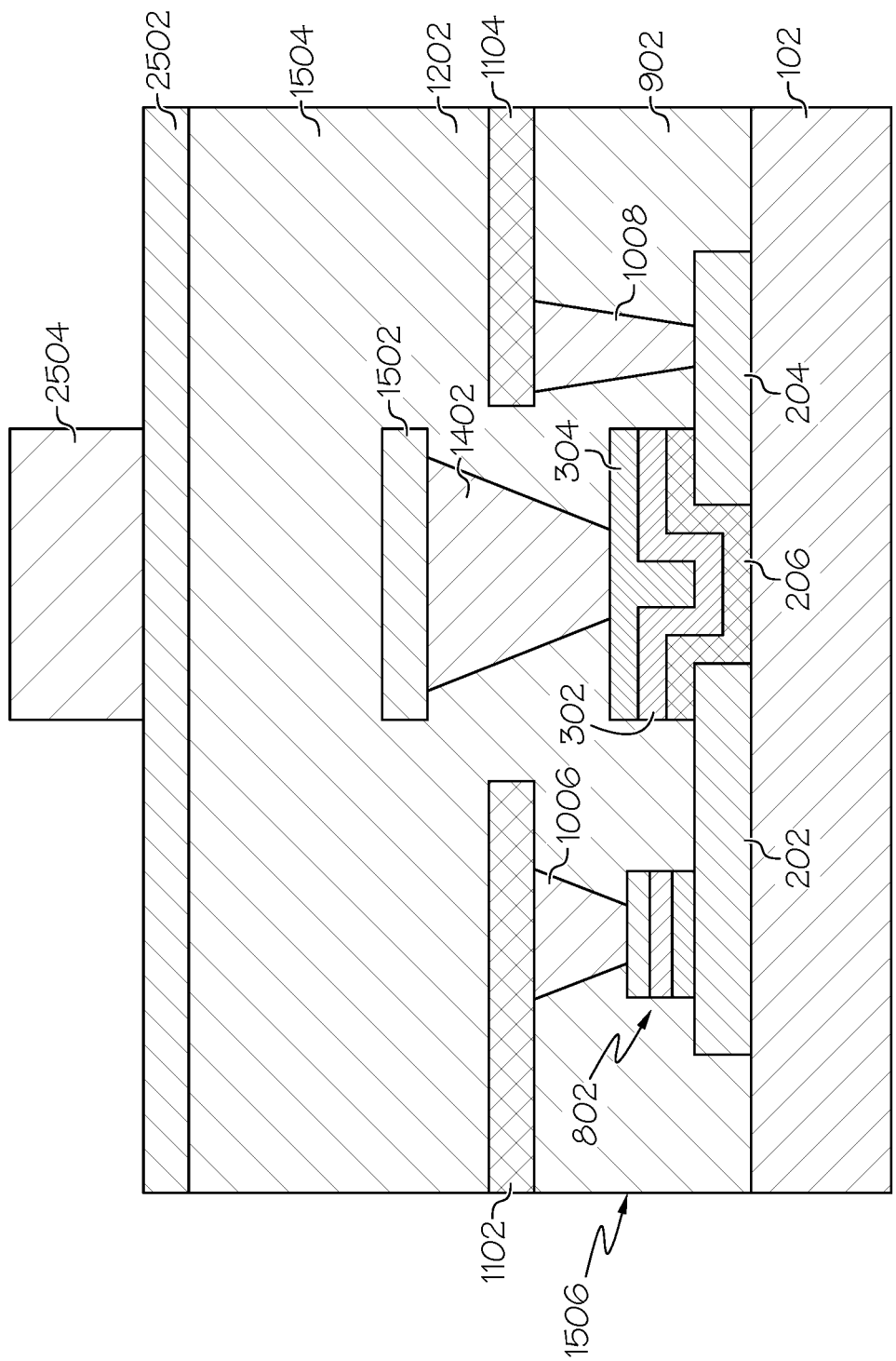
FIG. 25 is a cross-sectional view of a semiconductor structure after an additional word line metal layer material has been deposited above the transistor-MRAM unit cell of FIG. 15 according to one embodiment of the present invention.
Figure 26:
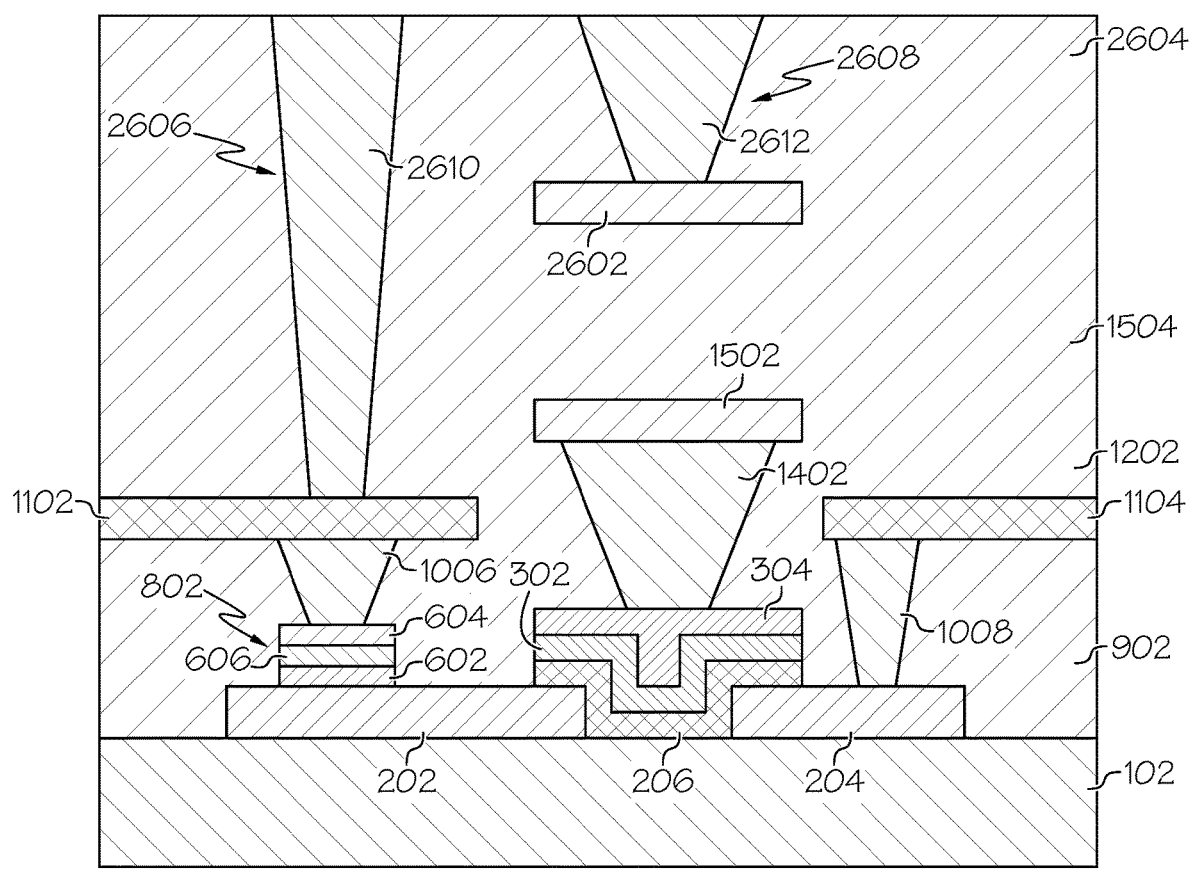
FIG. 26 is a cross-sectional view of a semiconductor structure after an additional word line metal layer and an additional bit line contact have been formed according to one embodiment of the present invention.

In another embodiment, one or more pairs of stacked 1T-1MRAM unit cells share a common bit line metal layer. For example, FIG. 25 shows that after the 1T-1MRAM unit cell 1506 of FIG. 15 has been fabricated an interconnect metal material 2502 is deposited on and in contact with the ILD layer 1504. A patterning mask 2504 is formed on and in contact with a portion of the interconnect metal material 2502 over the word line metal layer 1502 of the lower 1T-1MRAM unit cell 1506. One or more etching processes such as RIE are performed to remove exposed portions of the interconnect metal material 2502 to form a word line metal layer 2602, as shown in FIG. 26. The patterning mask 2504 may then be removed.

FIG. 26 further shows that after the word line metal layer 2602 has been formed an additional ILD layer 2604 is formed over the structure and above the word line metal layer 2602. Contact trenches 2606, 2608 are formed within the ILD layers 1202, 1504, 2604 using processes similar to those discussed above with respect to FIG. 10. The first contact trench 2606 exposes a top surface of at least a portion of the bit line metal layer 1102 of the lower 1T-1MRAM unit cell 1506. The second contact trench 2608 exposes a top surface of at least a portion of the upper word line metal layer 2602. FIG. 26 further shows that a conductive material is deposited into the contact trenches 2606, 2608 to form a bit line contact 2610 and a word line contact 2612. The bit line contact 2610 contacts the exposed portion of the top surface of bit line metal layer 1102 of the lower 1T-1MRAM unit cell 1506. The word line contact 2612 contacts the exposed portion of the top surface of the upper word line metal layer 2602. In this embodiment, the bit line metal layer 1102 is shared between bit line metal contacts 1006, 2610 of both 1T-1MRAM unit cells. The contacts 2610, 2612 may be formed using processes similar to those discussed above with respect to FIGS. 10 and 19.

Figure 27:
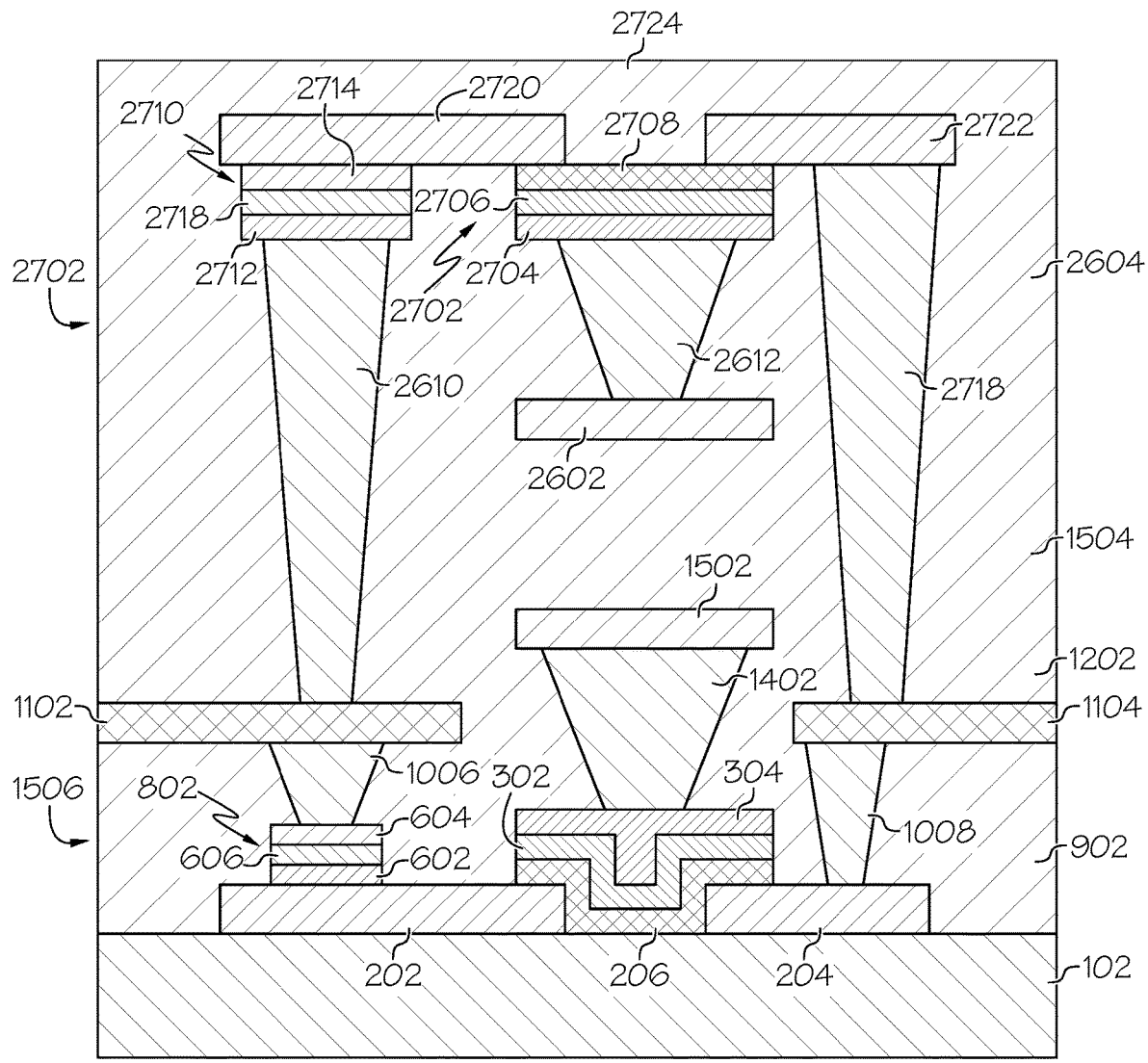
FIG. 27 is a cross-sectional view of a semiconductor structure after completion stacked transistor-MRAM unit cells comprising shared bit line metal layers according to one embodiment of the present invention.

The processes discussed above with respect to FIGS. 19-24 are performed to complete the upper 1T-1MRAM unit cell 2702, as shown in FIG. 27. For example, FIG. 27 shows that after contacts 2610, 2612 are formed a transistor stack 2704 is formed comprising a gate metal layer 2706, a gate dielectric layer 2708, and a thin-film semiconductor layer 2710. An MTJ stack 2712 comprising a first magnetic layer 2714, a second magnetic layer 2716, and an insulating layer 2718. A bit line complement contact 2720 is formed in contact with the bit line metal layer 1104 of the lower 1T-1MRAM unit cell 1506. The bit line complement contact 2720 of the upper 1T-1MRAM unit cell 2702 and the bit line complement contact 1008 of the lower 1T-1MRAM unit cell 1506 share bit line complement contact 1008. A source region 2722 is formed in contact with the top layer of the MTJ stack 2172 and the top surface of the thin-film semiconductor layer 2710. A drain region 2724 is formed in contact with the top surface of bit line complement contact 2720 and the top surface of the thin-film semiconductor layer 2710. An additional ILD layer 2726 is then formed over the structure and above the source/drain regions 2722, 2724.

Figure 28:
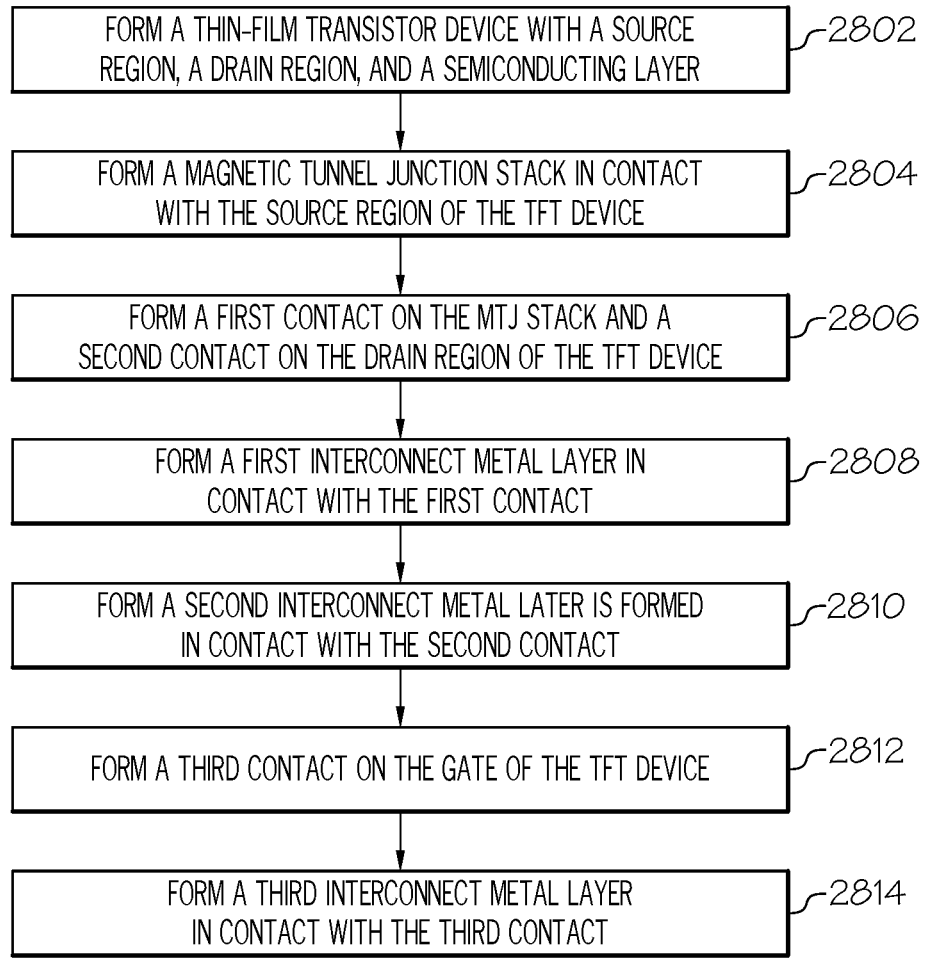
FIG. 28 is an operational flow diagram illustrating one example of a process for fabricating a semiconductor device comprising one or more transistor-MRAM unit cells according to one embodiment of the present invention.

FIG. 28 is an operational flow diagram illustrating one example of a process for fabricating a semiconductor device comprising one or more transistor-MRAM unit cells. It should be noted that each of the steps shown in FIG. 28 has been discussed in greater detail above with respect to FIGS. 1 to 27. A thin-film transistor, at step 2802, is formed with a source region, a drain region, and a semiconducting layer. A magnetic tunnel junction (MTJ) stack, at step 2804, is formed in contact with the source region. A first contact, at step 2806, is formed on the MTJ stack, and a second contact on the drain region of the TFT device. A first interconnect metal layer, at step 2808, is formed in contact with the first contact. A second interconnect metal layer, at step 2810, is formed in contact with the second contact. A third contact, at step 2812, is formed on the gate of the thin-film transistor TFT device. A third interconnect metal layer, at step 2814, is formed in contact with the third contact.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A semiconductor device comprising at least:
   a magnetoresistive random access memory (MRAM) device; and
   a thin-film transistor (TFT) device electrically coupled to the MRAM device, wherein the MRAM device and the TFT device are situated within a common plane of the semiconductor device, wherein the MRAM device and the TFT device form a MRAM-TFT device,
   wherein the TFT device comprises at least a thin-film semiconductor layer in contact with a substrate, a source region, and a drain region.

2. The semiconductor device of claim 1, wherein the MRAM-TFT device comprises at least:
   the source region and the drain region of the TFT device each in contact with the substrate;
   a magnetic tunnel junction stack of the MRAM device in contact with the source region of the TFT device;
   a bit line metal layer;
   a bit line contact in contact with the bit line metal layer and the magnetic tunnel junction stack; and
   a word line metal layer; and
   a word line contact in contact with the word line metal layer and a gate metal layer of the TFT device.

3. The semiconductor device of claim 2, wherein the MRAM-TFT device further comprises:
   an additional bit line metal layer; and
   a bit line complement contact in contact with the additional bit line metal layer and the drain region.

4. The semiconductor device of claim 1, wherein the TFT device further comprises at least:
   a gate dielectric layer in contact with the thin-film transistor; and
   a gate metal layer in contact with the gate dielectric layer and a word line contact of the MRAM device.

5. The semiconductor device of claim 1, further comprising:
   at least one additional MRAM device; and
   at least one additional TFT device electrically coupled to the at least one additional MRAM device,
   wherein the at least one MRAM device and the at least one additional TFT device are situated within a common plane of the semiconductor device, and
   wherein the at least one MRAM device and the at least one additional TFT device are situated above the MRAM device and the TFT device.

6. The semiconductor device of claim 5, wherein the MRAM device and the least one additional MRAM device each comprise a word line contact sharing a common word line metal layer.

7. The semiconductor device of claim 1, wherein TFT device comprises a thin-film semiconductor layer, wherein the thin-film semiconductor layer comprises one or more of:
   amorphous silicon;
   low temperate polysilicon;
   conductive metal oxides; and organic semiconductors.

8. A semiconductor device comprising at least:
   a first magnetoresistive random access memory (MRAM) device;
   a first thin-film transistor (TFT) device electrically coupled to the MRAM device, wherein the first MRAM device and the first TFT device are situated within a common plane of the semiconductor device, the first MRAM device and the first TFT device forming a first MRAM-TFT device;
   a second MRAM device; and
   a second TFT device electrically coupled to at least the second MRAM device, wherein the second MRAM device and the second TFT device are situated within a common plane of the semiconductor device, the second MRAM device and the second TFT device forming a second MRAM-TFT device situated above the first MRAM-TFT device, and
   wherein the first MRAM device and the second MRAM device share a common word line metal layer.

9. The semiconductor device of claim 8, wherein each of the first MRAM-TFT device and the second MRAM-TFT device comprises at least:
   a source region and a drain region of the first TFT device and the second TFT device, respectively;
   a magnetic tunnel junction stack of the first MRAM device and the second MRAM device, respectively, in contact with the source region of the first TFT device and the second TFT device, respectively;
   a bit line metal layer;
   a bit line contact in contact with the bit line metal layer and the magnetic tunnel junction stack; and
   a word line metal contact in contact with the common word line metal layer.

10. The semiconductor device of claim 8, wherein each of the first TFT device and the second TFT device comprises at least:
    a thin-film semiconductor layer in contact with a source region and a drain region;
    a gate dielectric layer in contact with the thin-film transistor; and
    a gate metal layer in contact with the gate dielectric layer and a word line contact.

11. The semiconductor device of claim 8, wherein the first TFT device and the second TFT device each comprise a thin-film semiconductor layer comprising one or more of:
    amorphous silicon;
    low temperate polysilicon;
    conductive metal oxides; and organic semiconductors.

12. The semiconductor device of claim 8, wherein a source region and a drain region of the first MRAM-TFT device is in direct contact with a substrate, and wherein a source region and a drain region of the second MRAM-TFT device is free of contact with the substrate.

13. A semiconductor device comprising at least:
    a magnetoresistive random access memory (MRAM) device; and
    a thin-film transistor (TFT) device electrically coupled to the MRAM device, wherein the MRAM device and the TFT device are laterally disposed with respect to each other within a common plane of the semiconductor device, wherein the MRAM device and the TFT device form a MRAM-TFT device.

14. The semiconductor device of claim 13, wherein the MRAM-TFT device comprises at least:
    a source region and a drain region of the TFT device each in contact with a substrate;
    a magnetic tunnel junction stack of the MRAM device in contact with the source region of the TFT device;
    a bit line metal layer;
    a bit line contact in contact with the bit line metal layer and the magnetic tunnel junction stack; and
    a word line metal layer; and
    a word line contact in contact with the word line metal layer and a gate metal layer of the TFT device.

15. The semiconductor device of claim 14, wherein the MRAM-TFT device further comprises:

an additional bit line metal layer; and a bit line complement contact in contact with the additional bit line metal layer and the drain region.

16. The semiconductor device of claim 13, wherein the TFT device comprises at least:

a thin-film semiconductor layer in contact with a substrate, a source region, and a drain region;

a gate dielectric layer in contact with the thin-film transistor; and a gate metal layer in contact with the gate dielectric layer and a word line contact of the MRAM device.

17. The semiconductor device of claim 13, further comprising:

at least one additional MRAM device; and at least one additional TFT device electrically coupled to the at least one additional MRAM device, wherein the at least one MRAM device and the at least one additional TFT device are situated within a common plane of the semiconductor device, and wherein the at least one MRAM device and the at least one additional TFT device are situated above the MRAM device and the TFT device.

18. The semiconductor device of claim 17, wherein the MRAM device and the least one additional MRAM device each comprise a word line contact sharing a common word line metal layer.

19. The semiconductor device of claim 13, wherein TFT device comprises a thin-film semiconductor layer, wherein the thin-film semiconductor layer comprises one or more of:

amorphous silicon;

low temperate polysilicon;

conductive metal oxides; and organic semiconductors.

20. The semiconductor device of claim 13, wherein the TFT and the MRAM device contact a common metal layer.

* * * * *